(12) United States Patent
Jeong

(10) Patent No.: US 9,564,422 B2
(45) Date of Patent: Feb. 7, 2017

(54) LIGHT EMITTING DEVICE AND LIGHT EMITTING DEVICE PACKAGE

(75) Inventor: Hwan Hee Jeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 358 days.

(21) Appl. No.: 13/442,102

(22) Filed: Apr. 9, 2012

(65) Prior Publication Data

US 2013/0049008 A1 Feb. 28, 2013

(30) Foreign Application Priority Data

Aug. 22, 2011 (KR) .................. 10-2011-0083723

(51) Int. Cl.
*H01L 29/15* (2006.01)
*H01L 25/075* (2006.01)
(Continued)

(52) U.S. Cl.
CPC ....... *H01L 25/0753* (2013.01); *H01L 33/0079* (2013.01); *H01L 33/38* (2013.01);
(Continued)

(58) Field of Classification Search
USPC .................. 257/79–103; 438/22–47
See application file for complete search history.

(56) References Cited

U.S. PATENT DOCUMENTS 6,194,743 B1 * 2/2001 Kondoh .................. H01L 33/40
257/745

2001/0004534 A1 * 6/2001 Carter-Coman ...... H01L 33/405
438/29
(Continued)

FOREIGN PATENT DOCUMENTS

CN 101828270 9/2010
CN 101960601 A 1/2011
(Continued)

OTHER PUBLICATIONS

European Search Report dated Jul. 25, 2014 issued in Application No. 12 151 102.6.
(Continued)

*Primary Examiner* — Mark Tornow
*Assistant Examiner* — Priya Rampersaud
(74) *Attorney, Agent, or Firm* — KED & Associates, LLP

(57) ABSTRACT

A light emitting device according to the embodiment includes a support substrate; a first light emitting structure disposed on the support substrate and including a first conductive type first semiconductor layer, a first active layer, and a second conductive type second semiconductor layer; a first reflective electrode under the first light emitting structure; a first metal layer around the first reflective electrode; a second light emitting structure disposed on the support substrate and including a first conductive type third semiconductor layer, a second active layer, and a second conductive type fourth semiconductor layer; a second reflective electrode under the second light emitting structure; a second metal layer around the second reflective electrode; and a contact part making contact with an inner portion of the first conductive type first semiconductor layer of the first light emitting structure and electrically connected to the second reflective electrode.

16 Claims, 15 Drawing Sheets

(51) Int. Cl.
*H01L 33/00* (2010.01)
*H01L 33/38* (2010.01)
*H01L 33/40* (2010.01)
*H01L 33/62* (2010.01)

(52) U.S. Cl.
CPC ............ *H01L 33/405* (2013.01); *H01L 33/62* (2013.01); *H01L 2224/48091* (2013.01)

(56) References Cited

U.S. PATENT DOCUMENTS

| | | | |
|---|---|---|---|
| 2005/0062049 A1* | 3/2005 | Lin et al. ........................ | 257/79 |
| 2010/0078656 A1 | 4/2010 | Seo et al. | |
| 2010/0155746 A1* | 6/2010 | Ibbetson et al. ................ | 257/88 |
| 2011/0049537 A1* | 3/2011 | Lee .................... | H01L 25/0753 |
| | | | 257/88 |
| 2011/0101390 A1 | 5/2011 | Engl et al. | |
| 2011/0169040 A1* | 7/2011 | Seo ...................... | H01L 27/156 |
| | | | 257/98 |
| 2011/0180804 A1* | 7/2011 | Su et al. ........................ | 257/76 |
| 2011/0193123 A1 | 8/2011 | Moon et al. | |
| 2011/0233587 A1 | 9/2011 | Unno | |
| 2011/0260205 A1* | 10/2011 | Moosburger ............ | H01L 27/15 |
| | | | 257/99 |
| 2011/0297972 A1 | 12/2011 | Seo et al. | |
| 2012/0091478 A1 | 4/2012 | Lee et al. | |
| 2012/0320581 A1* | 12/2012 | Rogers et al. ................ | 362/235 |
| 2013/0037836 A1 | 2/2013 | Kim et al. | |
| 2013/0140588 A1* | 6/2013 | Lee ...................... | H01L 27/156 |
| | | | 257/88 |
| 2014/0061703 A1 | 3/2014 | Von Malm ...................... | 257/98 |
| 2014/0110730 A1 | 4/2014 | Lee et al. ........................ | 257/88 |

FOREIGN PATENT DOCUMENTS

| | | |
|---|---|---|
| EP | 2 290 689 A2 | 3/2011 |
| JP | 2008-523637 A | 7/2008 |
| JP | 2010-087515 A | 4/2010 |
| JP | 2011-199221 A | 10/2011 |
| TW | 200512952 A | 4/2005 |
| WO | WO 2010/114250 A2 | 10/2010 |
| WO | WO 2012/130900 A1 | 10/2012 |

OTHER PUBLICATIONS

Chinese Office Action dated Mar. 10, 2016 issued in Application No. 201210023389.2 (English Translation attached).

Japanese Office Action dated Jan. 26, 2016 issued in Application No. 2012-004810.

Japanese Office Action issued in Application No. 2012-004810 dated Oct. 28, 2015.

Chinese Office Action dated Sep. 12, 2016 issued in Application No. 201210023389.2 (English translation attached).

* cited by examiner

LIGHT EMITTING DEVICE AND LIGHT EMITTING DEVICE PACKAGE

The present application claims priority under 35 U.S.C. 119 to Korean Patent Application No. 10-2011-0083723, filed on Aug. 22, 2011, which is hereby incorporated by reference in its entirety.

BACKGROUND

The embodiment relates to a light emitting device, a light emitting device package and a light unit.

LEDs (light emitting diodes) have been extensively used as light emitting devices. The LEDs convert electric signals into light, such as infrared ray, visible ray or ultraviolet ray, by using the characteristics of compound semiconductors.

As the light efficiency of the light emitting device has become increased, the light emitting device has been applied in various fields, such as display devices and lighting devices.

SUMMARY

The embodiment provides a light emitting device capable of improving process stability and comprising a plurality of cells electrically connected with each other, a light emitting device package and a light unit.

A light emitting device according to the embodiment comprises a support substrate; a first light emitting structure disposed on the support substrate and comprising a first conductive type first semiconductor layer, a first active layer under the first conductive type first semiconductor layer, and a second conductive type second semiconductor layer under the first active layer; a first reflective electrode under the first light emitting structure; a first metal layer around the first reflective electrode; a second light emitting structure disposed on the support substrate and comprising a first conductive type third semiconductor layer, a second active layer under the first conductive type third semiconductor layer, and a second conductive type fourth semiconductor layer under the second active layer; a second reflective electrode under the second light emitting structure; a second metal layer around the second reflective electrode; and a contact part making contact with an inner portion of the first conductive type first semiconductor layer of the first light emitting structure and electrically connected to the second reflective electrode.

A light emitting device according to the embodiment comprises a plurality of light emitting cells, each light emitting cell comprising a reflective electrode, a second conductive type semiconductor layer on the reflective electrode, an active layer on the second conductive type semiconductor layer, and a first conductive type semiconductor layer on the active layer; a contact part making contact with an inner portion of the first conductive type semiconductor layer of a first light emitting cell and electrically connected to the reflective electrode of a second light emitting cell adjacent to the first light emitting cell; and a metal layer around the reflective electrode of the second light emitting cell.

A light emitting device package according to the embodiment comprises a body; a light emitting device on the body; and first and second lead electrodes electrically connected to the light emitting device, wherein the light emitting device comprises a support substrate; a first light emitting structure disposed on the support substrate and comprising a first conductive type first semiconductor layer, a first active layer under the first conductive type first semiconductor layer, and a second conductive type second semiconductor layer under the first active layer; a first reflective electrode under the first light emitting structure; a first metal layer around the first reflective electrode; a second light emitting structure disposed on the support substrate and comprising a first conductive type third semiconductor layer, a second active layer under the first conductive type third semiconductor layer, and a second conductive type fourth semiconductor layer under the second active layer; a second reflective electrode under the second light emitting structure; a second metal layer around the second reflective electrode; and a contact part making contact with an inner portion of the first conductive type first semiconductor layer of the first light emitting structure and electrically connected to the second reflective electrode.

A light emitting device package according to the embodiment comprises a body; a light emitting device on the body; and first and second lead electrodes electrically connected to the light emitting device, wherein the light emitting device comprises a plurality of light emitting cells, each light emitting cell comprising a reflective electrode, a second conductive type semiconductor layer on the reflective electrode, an active layer on the second conductive type semiconductor layer, and a first conductive type semiconductor layer on the active layer; a contact part making contact with an inner portion of the first conductive type semiconductor layer of a first light emitting cell and electrically connected to the reflective electrode of a second light emitting cell adjacent to the first light emitting cell; and a metal layer around the reflective electrode of the second light emitting cell.

A light unit according to the embodiment comprises a board; a light emitting device installed on the board; and an optical member serving as an optical path of light emitted from the light emitting device, wherein the light emitting device comprises a support substrate; a first light emitting structure disposed on the support substrate and comprising a first conductive type first semiconductor layer, a first active layer under the first conductive type first semiconductor layer, and a second conductive type second semiconductor layer under the first active layer; a first reflective electrode under the first light emitting structure; a first metal layer around the first reflective electrode; a second light emitting structure disposed on the support substrate and comprising a first conductive type third semiconductor layer, a second active layer under the first conductive type third semiconductor layer, and a second conductive type fourth semiconductor layer under the second active layer; a second reflective electrode under the second light emitting structure; a second metal layer around the second reflective electrode; and a contact part making contact with an inner portion of the first conductive type first semiconductor layer of the first light emitting structure and electrically connected to the second reflective electrode.

A light unit according to the embodiment comprises a board; a light emitting device installed on the board; and an optical member serving as an optical path of light emitted from the light emitting device, wherein the light emitting device comprises a plurality of light emitting cells, each light emitting cell comprising a reflective electrode, a second conductive type semiconductor layer on the reflective electrode, an active layer on the second conductive type semiconductor layer, and a first conductive type semiconductor layer on the active layer; a contact part making contact with an inner portion of the first conductive type semiconductor layer of a first light emitting cell and electrically connected to the reflective electrode of a second light emitting cell adjacent to the first light emitting cell; and a metal layer around the reflective electrode of the second light emitting cell.

According to the light emitting device, the light emitting device package and the light unit of the embodiment, process stability can be improved and a plurality of cells electrically connected with each other can be provided.

DETAILED DESCRIPTION OF THE EMBODIMENTS

Figure 1A:
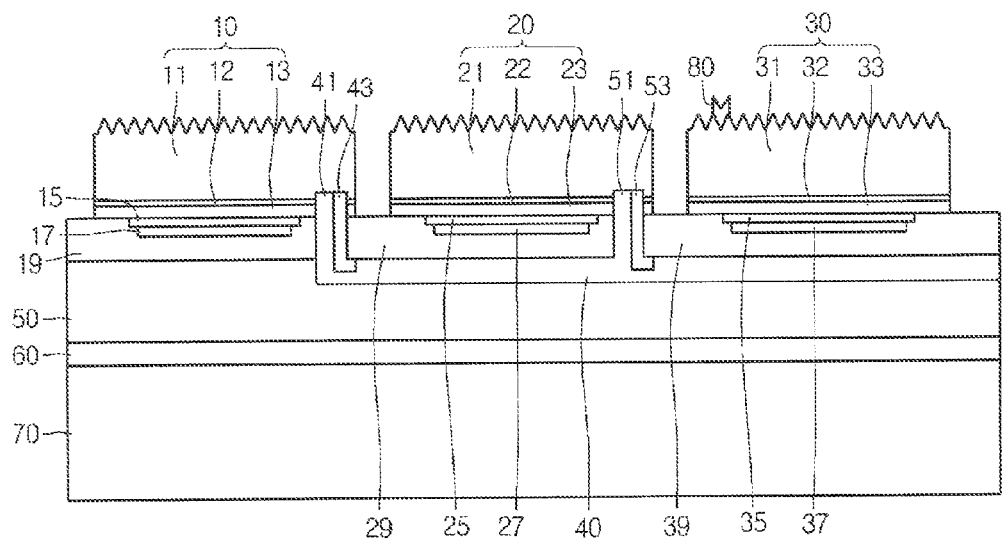
FIGS. 1A and 1B are views showing a light emitting device according to the embodiment.

In the description of the embodiments, it will be understood that when a layer (or film), a region, a pattern, or a structure is referred to as being "on" or "under" another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device, a light emitting device package, a light unit and a method for fabricating the light emitting device according to the embodiments will be described with reference to accompanying drawings.

FIG. 1 is a view showing the light emitting device according to the embodiment.

As shown in FIG. 1, the light emitting device according to the embodiment may comprise a first light emitting structure 10, a second light emitting structure 20, a third light emitting structure 30, a first reflective electrode 17, a second reflective electrode 27, a third reflective electrode 37 and an electrode 80. Although three light emitting structures are shown in FIG. 1, the light emitting device according to the embodiment may comprise two light emitting structures or at least four light emitting structures. The light emitting structures may be electrically connected with each other in series. In addition, the light emitting structures may be disposed on a support substrate 70.

The first light emitting structure 10 may comprise a first conductive type first semiconductor layer 11, a first active layer 12 and a second conductive type second semiconductor layer 13. The first active layer 12 is disposed between the first conductive type first semiconductor layer 11 and the second conductive type second semiconductor layer 13. The first active layer 12 may be disposed under the first conductive type first semiconductor layer 11 and the second conductive type second semiconductor layer 13 may be disposed under the first active layer 12.

For instance, the first conductive type first semiconductor layer 11 may be prepared as an n type semiconductor layer doped with an n type dopant as a first conductive type dopant, and the second conductive type second semiconductor layer 13 may be prepared as a p type semiconductor layer doped with a p type dopant as a second conductive type dopant. In contrast, the first conductive type first semiconductor layer 11 may be prepared as the p type semiconductor layer and the second conductive type second semiconductor layer 13 may be prepared as an n type semiconductor layer.

For instance, the first conductive type first semiconductor layer 11 may comprise an n type semiconductor layer. The first conductive type first semiconductor layer 11 may be prepared by using a semiconductor material having a compositional formula of $In_xAl_yGa_{1-x-y}N$ ($0 \leq x \leq 1$, $0 \leq y \leq 1$, $0 \leq x+y \leq 1$). For instance, the first conductive type first semiconductor layer 11 may comprise one selected from the group consisting of GaN, AlN, AlGaN, InGaN, InN, InAlGaN, AlInN, AlGaAs, GaP, GaAs, GaAsP, and AlGaInP and may be doped with the n type dopant, such as Si, Ge, Sn, Se, or Te.

The first active layer 12 emits the light based on the band gap difference of the energy band according to a material constituting the first active layer 12 through the recombination of electrons (or holes) injected through the first conductive type first semiconductor layer 11 and holes (or electrons) injected through the second conductive type second semiconductor layer 13. The first active layer 12 may have one of a single quantum well structure, a multiple quantum well (MQW) structure, a quantum dot structure, and a quantum wire structure, but the embodiment is not limited thereto.

The first active layer 12 may comprise a semiconductor material having a compositional formula of $In_xAl_yGa_{1-x-y}N$ ($0 \leq x \leq 1$, $0 \leq y \leq 1$, $0 \leq x+y \leq 1$). If the first active layer 12 has the MQW structure, the first active layer 12 may have a stack structure of a plurality of well layers and a plurality of barrier layers. For example, the first active layer 12 may comprise a stack structure of InGaN well/GaN barrier layers.

For instance, the second conductive type second semiconductor layer 13 may comprise a p type semiconductor layer. The second conductive type second semiconductor layer 13 may be prepared by using a semiconductor material having a compositional formula of $In_xAl_yGa_{1-x-y}N$ ($0 \leq x \leq 1$, $0 \leq y \leq 1$, $0 \leq x+y \leq 1$). For instance, the second conductive type second semiconductor layer 13 may comprise one selected from the group consisting of GaN, AlN, AlGaN, InGaN, InN, InAlGaN, AlInN, AlGaAs, GaP, GaAs, GaAsP, and AlGaInP and may be doped with the p type dopant, such as Mg, Zn, Ca, Sr or Ba.

Meanwhile, the first conductive type first semiconductor layer 11 may comprise a p type semiconductor layer, and the second conductive type second semiconductor layer 13 may comprise an n type semiconductor layer. In addition, a semiconductor layer comprising an n type semiconductor layer or a p type semiconductor layer may be formed under the second conductive type second semiconductor layer 13. Accordingly, the light emitting structure may have at least one of NP, PN, NPN, and PNP junction structures. In addition, the doping concentration of impurities in the first conductive type first semiconductor layers 11 and the second conductive type second semiconductor layer 13 may be uniform or non-uniform. In other words, the light emitting structure 10 may be variously formed without limitations.

In addition, a first conductive type InGaN/GaN superlattice structure or a first conductive type InGaN/InGaN superlattice structure may be rimmed between the first conductive type first semiconductor layers 11 and the first active layer 12. In addition, a second conductive type AlGaN layer may be fowled between the second conductive type second semiconductor layers 13 and the first active layer 12.

In addition, the second light emitting structure 20 may comprise a first conductive type third semiconductor layer 21, a second active layer 22 and a second conductive type fourth semiconductor layer 23. The second active layer 22 is disposed between the first conductive type third semiconductor layer 21 and the second conductive type fourth semiconductor layer 23. The second active layer 22 may be disposed under the first conductive type third semiconductor layer 21 and the second conductive type fourth semiconductor layer 23 may be disposed under the second active layer 22. The second light emitting structure 20 may be prepared similarly to the first light emitting structure 10 described above.

Further, the third light emitting structure 30 may comprise a first conductive type fifth semiconductor layer 31, a third active layer 32 and a second conductive type sixth semiconductor layer 33. The third active layer 32 is disposed between the first conductive type fifth semiconductor layer 31 and the second conductive type sixth semiconductor layer 33. The third active layer 32 may be disposed under the first conductive type fifth semiconductor layer 31 and the second conductive type sixth semiconductor layer 33 may be disposed under the third active layer 32. The third light emitting structure 30 may be prepared similarly to the first light emitting structure 10 described above.

A first ohmic contact layer 15 and a first reflective electrode 17 may be disposed under the first light emitting structure 10. A first metal layer 19 may be disposed under the first light emitting structure 10 and around the first reflective electrode 17. The first metal layer 19 may be disposed around the first ohmic contact layer 15 and under the first reflective electrode 17.

For instance, the first ohmic contact layer 15 may comprise a transparent conductive oxide layer. In detail, the first ohmic contact layer 15 may comprise at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, NiO, Pt, and Ag.

The first reflective electrode 17 may comprise a metallic material having high reflectivity. For instance, the first reflective electrode 17 may comprise a metal or an alloy comprising at least one selected from the group consisting of Ag, Ni, Al, Rh, Pd, Ir, Ru, Mg, Zn, Pt, Au, and Hf. In addition, the first reflective electrode 17 may be formed in a multiple structure by using the metal or the alloy and transmissive conductive material such as ITO (Indium-Tin-Oxide), IZO (Indium-Zinc-Oxide), IZTO (Indium-Zinc-Tin-Oxide), IAZO (Indium-Aluminum-Zinc-Oxide), IGZO (Indium-Gallium-Zinc-Oxide), IGTO (Indium-Gallium-Tin-Oxide), AZO (Aluminum-Zinc-Oxide) or ATO (Antimony-Tin-Oxide). For example, the first reflective electrode 17 may comprise at least one of Ag, Al, an Ag—Pd—Cu alloy and an Ag—Cu alloy.

The first ohmic contact layer 15 makes ohmic-contact with the first light emitting structure 10. In addition, the first reflective electrode 17 may increase quantity of light extracted to the outside by reflecting the light incident from the first light emitting structure 10.

When a bonding layer 60 is formed, the first metal layer 19 may prevent materials included in the bonding layer 60 from diffusing toward the first reflective electrode 17. In detail, the first metal layer 19 may prevent the materials included in the bonding layer 60, such as Sn, from exerting an influence upon the first reflective electrode 17. The first metal layer 19 may comprise at least one of Cu, Ni, Ti—W, W, Pt, V, Fe, Mo, Ti and Cr. The first metal layer 19 may comprise a transparent conductive oxide layer. The first metal layer 19 may be referred to as an isolation layer or a channel layer.

In addition, a second ohmic contact layer 25 and a second reflective electrode 27 may be disposed under the second light emitting structure 20. A second metal layer 29 may be disposed under the second light emitting structure 20 and around the second reflective electrode 27. The second metal layer 29 may be disposed around the second ohmic contact layer 25 and under the second reflective electrode 27. A first region of the second metal layer 29 may be exposed between the first light emitting structure 10 and the second light emitting structure 20.

For instance, the second ohmic contact layer 25 may comprise a transparent conductive oxide layer. In detail, the second ohmic contact layer 25 may comprise at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, NiO, Pt, and Ag.

The second reflective electrode 27 may comprise a metallic material having high reflectivity. For instance, the second reflective electrode 27 may comprise a metal or an alloy comprising at least one selected from the group consisting of Ag, Ni, Al, Rh, Pd, Ir, Ru, Mg, Zn, Pt, Au, and Hf. In addition, the second reflective electrode 27 may be formed in a multiple structure by using the metal or the alloy and transmissive conductive material such as ITO (Indium-Tin-Oxide), IZO (Indium-Zinc-Oxide), IZTO (Indium-Zinc-Tin-Oxide), IAZO (Indium-Aluminum-Zinc-Oxide), IGZO (Indium-Gallium-Zinc-Oxide), IGTO (Indium-Gallium-Tin-Oxide), AZO (Aluminum-Zinc-Oxide) or ATO (Antimony-Tin-Oxide). For example, the second reflective electrode 27 may comprise at least one of Ag, Al, an Ag—Pd—Cu alloy and an Ag—Cu alloy.

The second ohmic contact layer 25 makes ohmic-contact with the second light emitting structure 20. In addition, the second reflective electrode 27 may increase quantity of light extracted to the outside by reflecting the light incident from the second light emitting structure 20.

When the bonding layer 60 is formed, the second metal layer 29 may prevent materials included in the bonding layer 60 from diffusing toward the second reflective electrode 27. In detail, the second metal layer 29 may prevent the materials included in the bonding layer 60, such as Sn, from exerting an influence upon the second reflective electrode 27. The second metal layer 29 may comprise at least one of Cu, Ni, Ti—W, W, Pt, V, Fe, Mo, Ti and Cr. The second metal layer 29 may comprise a transparent conductive oxide layer. The second metal layer 29 may be referred to as an isolation layer or a channel layer.

In addition, a third ohmic contact layer 35 and a third reflective electrode 37 may be disposed under the third light emitting structure 30. A third metal layer 39 may be disposed under the third light emitting structure 30 and around the third reflective electrode 37. The third metal layer 39 may be disposed around the third ohmic contact layer 35 and under the third reflective electrode 37. A first region of the third metal layer 39 may be exposed between the second light emitting structure 20 and the third light emitting structure 30.

For instance, the third ohmic contact layer 35 may comprise a transparent conductive oxide layer. In detail, the third ohmic contact layer 35 may comprise at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, NiO, Pt, and Ag.

The third reflective electrode 37 may comprise a metallic material having high reflectivity. For instance, the third reflective electrode 37 may comprise a metal or an alloy comprising at least one selected from the group consisting of Ag, Ni, Al, Rh, Pd, Ir, Ru, Mg, Zn, Pt, Au, and Hf. In addition, the third reflective electrode 37 may be formed in a multiple structure by using the metal or the alloy and transmissive conductive material such as ITO (Indium-Tin-Oxide), IZO (Indium-Zinc-Oxide), IZTO (Indium-Zinc-Tin-Oxide), IAZO (Indium-Aluminum-Zinc-Oxide), IGZO (Indium-Gallium-Zinc-Oxide), IGTO (Indium-Gallium-Tin-Oxide), AZO (Aluminum-Zinc-Oxide) or ATO (Antimony-Tin-Oxide). For example, the second reflective electrode 27 may comprise at least one of Ag, Al, an Ag—Pd—Cu alloy and an Ag—Cu alloy.

The third ohmic contact layer 35 makes ohmic-contact with the third light emitting structure 30. In addition, the third reflective electrode 37 may increase quantity of light extracted to the outside by reflecting the light incident from the third light emitting structure 30.

When the bonding layer 60 is formed, the third metal layer 39 may prevent bonding materials included in the bonding layer 60 from diffusing toward the third reflective electrode 37. In detail, the third metal layer 39 may prevent the materials included in the bonding layer 60, such as Sn, from exerting an influence upon the third reflective electrode 37. The third metal layer 39 may comprise at least one of Cu, Ni, Ti—W, W, Pt, V, Fe, Mo, Ti and Cr. The third metal layer 39 may comprise a transparent conductive oxide layer. The third metal layer 39 may be referred to as an isolation layer or a channel layer.

A first contact part 43 may be disposed under the first light emitting structure 10. The first contact part 43 makes contact with an inner portion of the first conductive type first semiconductor layer 11. The first contact part 43 makes contact with a lower portion of the second metal layer 29. The first contact part 43 makes contact with a lateral side of the second metal layer 29. Since the second metal layer 29 is electrically connected to the second reflective electrode 27, the second ohmic contact layer 25 and the second conductive type fourth semiconductor layer 23, the first contact part 43 can be electrically connected to the second reflective electrode 27, the second ohmic contact layer 25 and the second conductive type fourth semiconductor layer 23. Thus, the first conductive type first semiconductor layer 11 is electrically connected to the second conductive type fourth semiconductor layer 23 through the first contact part 43.

For instance, the first contact part 43 may comprise at least one selected from the group consisting of Cr, Al, Ti, Ni, Pt, and V. In addition, the first contact part 43 may comprise a transparent conductive oxide layer. In detail, the first contact part 43 may comprise at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, and NiO.

The first contact part 43 can make contact with the inner portion of the first conductive type first semiconductor layer 11. For instance, the first conductive type first semiconductor layer 11 may comprise a GaN layer. When taking the growing direction and etching direction of the semiconductor layer into consideration, the first contact part 43 makes contact with a Ga face of the first conductive type first semiconductor layer 11. According to the embodiment, since the first contact part 43 makes contact with the Ga face of the first conductive type first semiconductor layer 11, the thermal stability can be ensured as compared with the case in which the first contact part 43 makes contact with an N face of the first conductive type first semiconductor layer 11. In addition, according to the embodiment, since the first contact part 43 makes contact with the Ga face of the first conductive type first semiconductor layer 11, variation of the characteristic curve according to the operating voltage may be diminished as compared with the case in which the first contact part 43 makes contact with an N face of the first conductive type first semiconductor layer 11, so that the reliability can be improved and high current application is possible.

A first insulating layer 41 may be disposed between the first contact part 43 and the second conductive type second semiconductor layer 13. The first insulating layer 41 may be disposed between the first contact part 43 and the first active layer 12. For instance, the first insulating layer 41 may comprise a transmittive and insulating material, such as $SiO_2$, $SiO_x$, $SiO_xN_y$, $Si_3N_4$, $Al_2O_3$, $TiO_2$ or AlN.

A second contact part 53 may be disposed under the second light emitting structure 20. The second contact part 53 electrically connects the first conductive type third semiconductor layer 21 with the third reflective electrode 37. The second contact part 53 makes contact with an inner portion of the first conductive type third semiconductor layer 21. The second contact part 53 makes contact with a lower portion of the third metal layer 39. The second contact part 53 makes contact with a lateral side of the third metal layer 39. Since the third metal layer 39 is electrically connected to the third reflective electrode 37, the third ohmic contact layer 35 and the second conductive type sixth semiconductor layer 33, the second contact part 53 can be electrically connected to the third reflective electrode 37, the third ohmic contact layer 35 and the second conductive type sixth semiconductor layer 33. Thus, the first conductive type third semiconductor layer 21 is electrically connected to the second conductive type sixth semiconductor layer 33 through the second contact part 53.

For instance, the second contact part 53 may comprise at least one selected from the group consisting of Cr, Al, Ti, Ni, Pt, and V. In addition, the second contact part 53 may comprise a transparent conductive oxide layer. In detail, the second contact part 53 may comprise at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, and NiO.

The second contact part 53 can make contact with the inner portion of the first conductive type third semiconductor layer 21. For instance, the first conductive type third semiconductor layer 21 may comprise a GaN layer. When taking the growing direction and etching direction of the semiconductor layer into consideration, the second contact part 53 makes contact with a Ga face of the first conductive type third semiconductor layer 21. According to the embodiment, since the second contact part 53 makes contact with the Ga face of the first conductive type third semiconductor layer 21, the thermal stability can be ensured as compared with the case in which the second contact part 53 makes contact with an N face of the first conductive type third semiconductor layer 21. In addition, according to the embodiment, since the second contact part 53 makes contact with the Ga face of the first conductive type third semiconductor layer 21, variation of the characteristic curve according to the operating voltage may be diminished as compared with the case in which the second contact part 53 makes contact with an N face of the first conductive type third semiconductor layer 21, so that the reliability can be improved and high current application is possible.

A second insulating layer 51 may be disposed between the second contact part 53 and the second conductive type fourth semiconductor layer 23. The second insulating layer 51 may be disposed between the second contact part 53 and the second active layer 22. The second insulating layer 51 may comprise a transmittive and insulating material, such as $SiO_2$, $SiO_x$, $SiO_xN_y$, $Si_3N_4$, $Al_2O_3$, $TiO_2$, or AlN.

A third insulating layer 40 may be disposed under the second and third metal layers 29 and 39. The third insulating layer 40 may comprise oxide or nitride. For instance, the third insulating layer 40 may comprise a transmittive and insulating material, such as $SiO_2$, $SiO_x$, $SiO_xN_y$, $Si_3N_4$, or $Al_2O_3$. A first region of the third insulating layer 40 makes contact with a lower portion of the first insulating layer 41. A second region of the third insulating layer 40 makes contact with a lower portion of the second insulating layer 51. The first to third insulating layers 41, 51 and 40 may be integrally formed as one insulating layer.

A diffusion barrier layer 50, the bonding layer 60 and a support member 70 may be disposed under the first metal layer 19 and the third insulating layer 40.

When the bonding layer 60 is formed, the diffusion barrier layer 50 may prevent materials included in the bonding layer 60 from diffusing toward the first to third reflective electrodes 17, 27 and 37. In detail, the diffusion barrier layer 50 may prevent the materials included in the bonding layer 60, such as Sn, from exerting an influence upon the first to third reflective electrodes 17, 27 and 37. The diffusion barrier layer 50 may comprise at least one of Cu, Ni, Ti—W, W, Pt, V, Fe, and Mo.

The bonding layer 60 may comprise a barrier metal or a bonding metal. For instance, the bonding layer 60 may comprise at least one of Ti, Au, Sn, Ni, Cr, Ga, In, Bi, Cu, Ag, Nb, Pd and Ta. The support member 70 supports the light emitting device according to the embodiment and is electrically connected to an external electrode to supply power to the first light emitting structure 10. The bonding layer 60 may be prepared as a seed layer.

For instance, the support member 70 may comprise at least one selected from the group consisting of Ti, Cr, Ni, Al, Pt, Au, W, Cu, Mo, Cu—W and a semiconductor substrate doped with impurities (i.e., Si, Ge, GaN, GaAs, ZnO, SiC, or SiGe). The support member 70 may comprise an insulating material. For instance, the support member 70 may comprise $Al_2O_3$ or $SiO_2$.

Meanwhile, an electrode 80 is disposed on the first conducive fifth semiconductor layer 31. The electrode 80 is electrically connected to the first conducive fifth semiconductor layer 31. The electrode 80 makes contact with the top surface of the first conducive fifth semiconductor layer 31.

Therefore, the power is supplied to the first to third light emitting structures 10, and 30 through the electrode 80 and the first reflective electrode 17. The first to third light emitting structures 10, 20 and 30 are connected with each other in series. Thus, as the power is applied through the electrode 80 and the first reflective electrode 17, the first to third light emitting structures 10, 20 and 30 may emit the light.

According to the embodiment, the electrode 80 may have a multi-layer structure. For instance, the electrode 80 may comprise an ohmic contact layer, an intermediate layer and an upper layer. The ohmic contact layer may comprise one selected from the group consisting of Cr, V, W, Ti, and Zn in order to realize the ohmic contact. The intermediate layer may comprise one selected from the group consisting of Ni, Cu and Al. The upper layer may comprise Au.

Light extracting patterns may be formed on the top surfaces of the first to third light emitting structures 10, 20 and 30. In detail, concavo-convex patterns are formed on the top surfaces of the first to third light emitting structures 10, 20 and 30. Therefore, according to the embodiment, the external light extraction efficiency can be improved.

Figure 1B:
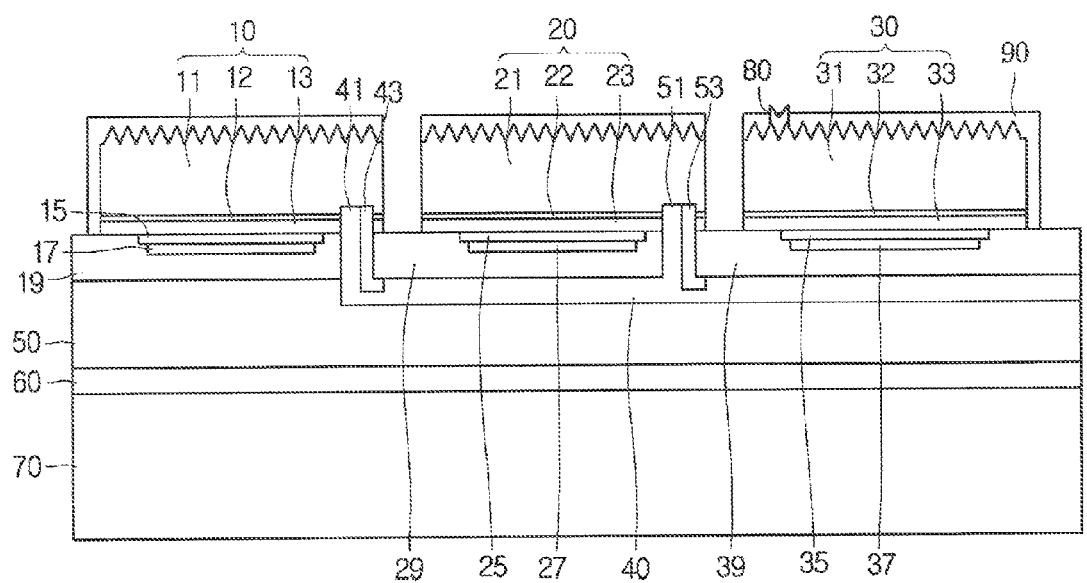

A protective layer 90 may be further formed on the first to third light emitting structures 10, 20 and 30 as shown in FIG. 1B. The protective layer 90 may comprise oxide or nitride. For instance, the protective layer 90 may comprise a transmittive and insulating material, such as $SiO_2$, $SiO_x$, $SiO_xN_y$, $Si_3N_4$, or $Al_2O_3$. The protective layer 90 may be disposed around the first and third light emitting structures 10 and 30.

According to the embodiment, adjacent light emitting structures can be electrically connected with each other in series through the first and second contact parts 43 and 53. The first light emitting structure 10 may be spaced apart from the second light emitting structure 20. The second metal layer 29 may be exposed between the first and second light emitting structures 10 and 20. In addition, the second light emitting structure 20 may be spaced apart from the third light emitting structure 30. The third metal layer 39 may be exposed between the second and third light emitting structures 20 and 30.

In the light emitting device according to the embodiment, a plurality of light emitting structures are electrically connected with each other in series and high voltage can be applied to the light emitting device. In addition, since the insulating layer is not formed among the light emitting structures, the light emitting structures can be prevented from being damaged caused by thermal deformation of the insulating layer. Thus, the light emitting device according to the embodiment may have relatively high reliability.

The light emitting device according to the embodiment comprises a plurality of light emitting cells. Each light emitting cell may comprise a reflective electrode, a second conductive type semiconductor layer on the reflective electrode, an active layer on the second conductive type semiconductor layer, and a first conductive type semiconductor layer on the active layer. In addition, the light emitting device comprises a contact part that makes contact with an inner portion of the first conductive type semiconductor layer of a first light emitting cell and is electrically connected to the reflective electrode of the second light emitting cell adjacent to the first light emitting cell. In addition, the light emitting cell may comprise a metal layer disposed around the reflective electrode of the second light emitting cell. A part of the metal layer may be exposed between the first and second light emitting cells. The contact part makes contact with a lower portion of the metal layer of the second light emitting cell. The contact part makes contact with a lateral side of the metal layer of the second light emitting cell. In addition, the light emitting device may comprise an electrode electrically connected to the first conductive type semiconductor layer of the second light emitting cell. Thus, as the power is supplied to the reflective electrode of the first light emitting cell and the electrode connected to the second light emitting cell, the first light emitting cell is electrically connected to the second light emitting cell in series, so that the light can be emitted.

Hereinafter, the method for fabricating the light emitting device according to the embodiment will be described with reference to FIGS. 2 to 7.

Figure 2:
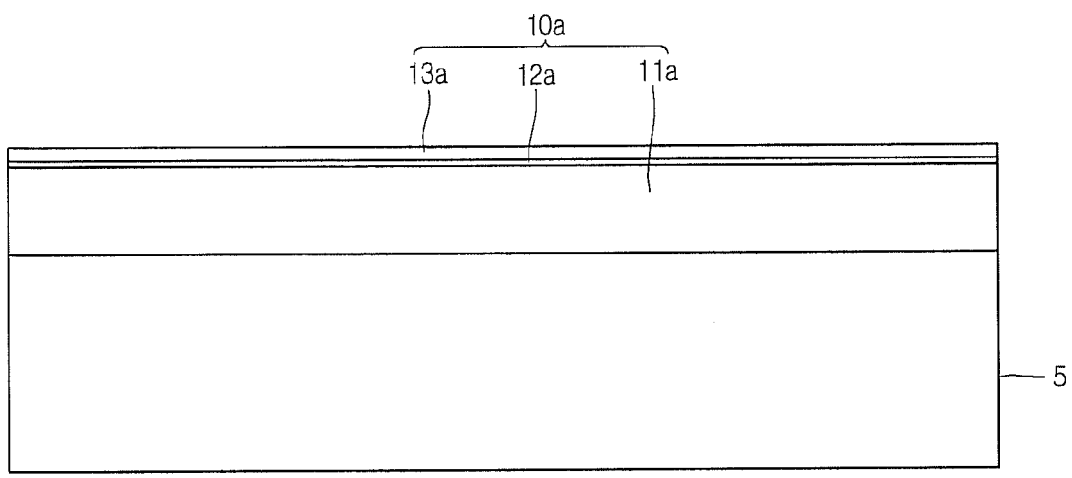
FIGS. 2 to 7 are views showing a method for fabricating a light emitting device according to the embodiment.

According to the method for fabricating the light emitting device if the embodiment, as shown in FIG. 2, a first conductive type semiconductor layer 11a, an active layer 12a, and a second conductive type semiconductor layer 13a are formed on a growth substrate 5. The first conductive type semiconductor layer 11a, the active layer 12a, and the second conductive type semiconductor layer 13a may constitute a light emitting structure 10a.

The growth substrate 5 may comprise at least one of $Al_2O_3$, SiC, GaAs, GaN, ZnO, Si, GaP, InP, and Ge, but the embodiment is not limited thereto. A buffer layer may be disposed between the first conductive type first semiconductor layer 11 and the growth substrate 5.

For instance, the first conductive type semiconductor layer 11a may be prepared as an n type semiconductor layer doped with an n type dopant as a first conductive type dopant, and the second conductive type semiconductor layer 13a may be prepared as a p type semiconductor layer doped with a p type dopant as a second conductive type dopant. In contrast, the first conductive type semiconductor layer 11a may be prepared as the p type semiconductor layer and the second conductive type semiconductor layer 13a may be prepared as an n type semiconductor layer.

For instance, the first conductive type semiconductor layer 11a may comprise an n type semiconductor layer. The first conductive type semiconductor layer 11a may be prepared by using a semiconductor material having a compositional formula of $In_xAl_yGa_{1-x-y}N$ ($0 \leq x \leq 1$, $0 \leq y \leq 1$, $0 \leq x+y \leq 1$). For instance, the first conductive type first semiconductor layer 11 may comprise one selected from the group consisting of GaN, AlN, AlGaN, InGaN, InN, InAlGaN, AlInN, AlGaAs, GaP, GaAs, GaAsP, and AlGaInP and may be doped with the n type dopant, such as Si, Ge, Sn, Se, or Te.

The active layer 12a emits the light based on the band gap difference of the energy band according to a material constituting the active layer 12a through the recombination of electrons (or holes) injected through the first conductive type semiconductor layer 11a and holes (or electrons) injected through the second conductive type semiconductor layer 13a. The active layer 12a may have one of a single quantum well structure, a multiple quantum well (MQW) structure, a quantum dot structure, and a quantum wire structure, but the embodiment is not limited thereto.

The active layer 12a may comprise a semiconductor material having a compositional formula of $In_xAl_yGa_{1-x-y}N$ ($0 \leq x \leq 1$, $0 \leq y \leq 1$, $0 \leq x+y \leq 1$). If the active layer 12a has the MQW structure, the active layer 12a may have a stack structure of a plurality of well layers and a plurality of barrier layers. For example, the active layer 12a may comprise a stack structure of InGaN well/GaN barrier layers.

For instance, the second conductive type semiconductor layer 13a may comprise a p type semiconductor layer. The second conductive type semiconductor layer 13a may be prepared by using a semiconductor material having a compositional formula of $In_xAl_yGa_{1-x-y}N$ ($0 \leq x \leq 1$, $0 \leq y \leq 1$, $0 \leq x+y \leq 1$). For instance, the second conductive type semiconductor layer 13a may comprise one selected from the group consisting of GaN, AlN, AlGaN, InGaN, InN, InAlGaN, AlInN, AlGaAs, GaP, GaAs, GaAsP, and AlGaInP and may be doped with the p type dopant, such as Mg, Zn, Ca, Sr or Ba.

Meanwhile, the first conductive type semiconductor layer 11a may comprise a p type semiconductor layer, and the second conductive type semiconductor layer 13a may comprise an n type semiconductor layer. In addition, a semiconductor layer comprising an n type semiconductor layer or a p type semiconductor layer may be formed under the second conductive type semiconductor layer 13a. Accordingly, the light emitting structure 10a may have at least one of NP, PN, NPN, and PNP junction structures. In addition, the doping concentration of impurities in the first conductive type semiconductor layers 11a and the second conductive type semiconductor layer 13a may be uniform or non-uniform. In other words, the light emitting structure 10a may be variously formed without limitations.

In addition, a first conductive type InGaN/GaN superlattice structure or a first conductive type InGaN/InGaN superlattice structure may be formed between the first conductive type semiconductor layers 11a and the active layer 12a. In addition, a second conductive type AlGaN layer may be formed between the second conductive type semiconductor layers 13a and the active layer 12a.

Figure 3:
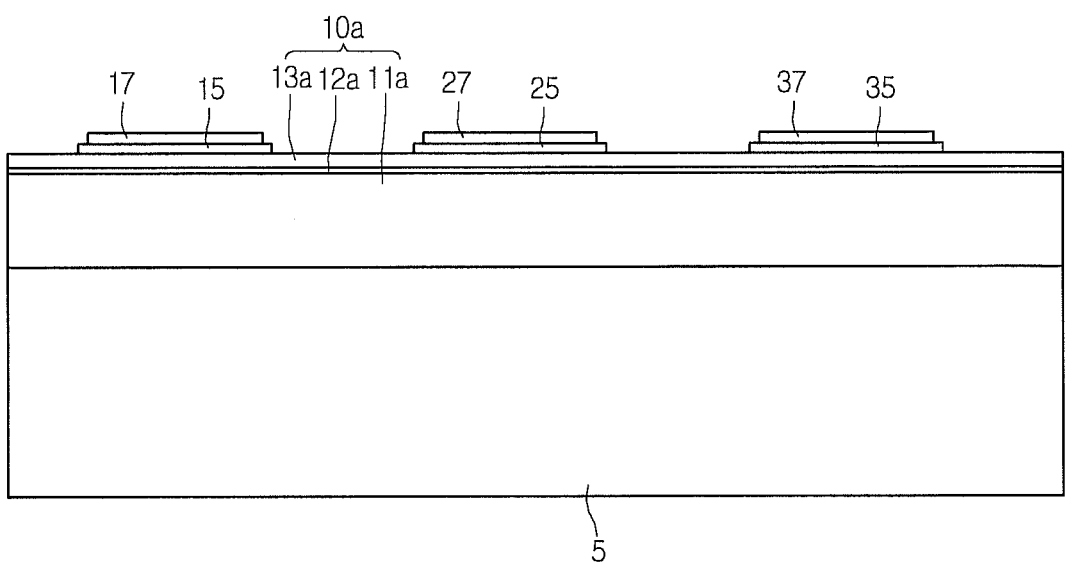

Then, as shown in FIG. 3, the first ohmic contact layer 15 and the first reflective electrode 17 are formed on a first region of the second conductive type semiconductor layer 13a. In addition, the second ohmic contact layer 25 and the second reflective electrode 27 are formed on a second region of the second conductive type semiconductor layer 13a and the third ohmic contact layer 35 and the third reflective electrode 37 are formed on a third region of the second conductive type semiconductor layer 13a.

For instance, the first to third ohmic contact layers 15, 25 and 35 may comprise a transparent conductive oxide layer. In detail, the first to third ohmic contact layers 15, 25 and 35 may comprise at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, NiO, Pt, and Ag.

The first to third reflective electrodes 17, 27 and 37 may comprise a metallic material having high reflectivity. For instance, the first to third reflective electrodes 17, 27 and 37 may comprise a metal or an alloy comprising at least one selected from the group consisting of Ag, Ni, Al, Rh, Pd, Ir, Ru, Mg, Zn, Pt, Au, and Hf. In addition, the first to third reflective electrodes 17, 27 and 37 may be formed in a multiple structure by using the metal or the alloy and transmissive conductive material such as ITO (Indium-Tin-Oxide), IZO (Indium-Zinc-Oxide), IZTO (Indium-Zinc-Tin-Oxide), IAZO (Indium-Aluminum-Zinc-Oxide), IGZO (Indium-Gallium-Zinc-Oxide), IGTO (Indium-Gallium-Tin-Oxide), AZO (Aluminum-Zinc-Oxide) or ATO (Antimony-Tin-Oxide). For example, the first to third reflective electrodes 17, 27 and 37 may comprise at least one of Ag, Al, an Ag—Pd—Cu alloy and an Ag—Cu alloy.

Figure 4:
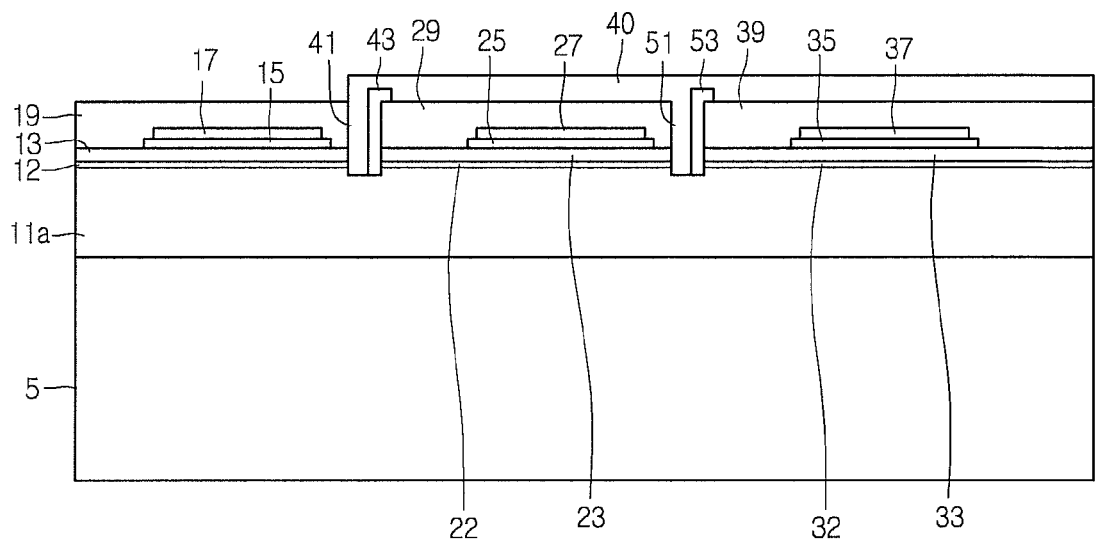

Then, as shown in FIG. 4, the metal layer is formed on the first to third reflective electrodes 17, 27 and 37, and the first contact part 43, the first insulating layer 41, the second contact part 53 and the second insulating layer 51 are formed on the first conductive type semiconductor layer 11a. The first metal layer 19 is separated from the second metal layer 29 by the first contact part 43 and the first insulating layer 41. The second metal layer 29 is separated from the third metal layer 39 by the second contact part 53 and the second insulating layer 51. Then, the third insulating layer 40 is formed on the first insulating layer 41, the second insulating layer 51, the first contact part 43 and the second contact part 53. The third insulating layer 40 and the first and second insulating layers 41 and 51 may be formed through the same process or separate processes.

For instance, the first and second contact parts 43 and 53 may comprise at least one selected from the group consisting of Cr, Al, Ti, Ni, Pt, and V. In addition, the first and second contact parts 43 and 53 may comprise a transparent conductive oxide layer. In detail, the first and second contact parts 43 and 53 may comprise at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, and NiO.

The first to third insulating layers 41, 51 and 41 can be formed by using a transmittive and insulating material, such as $SiO_2$, $SiO_x$, $SiO_xN_y$, $Si_3N_4$, $Al_2O_3$, $TiO_2$, or AlN.

The first to third metal layers 19, 29 and 39 may comprise at least one of Cu, Ni, Ti—W, W, Pt, V, Fe, Mo, Ti, and Cr. The first to third metal layers 19, 29 and 39 may be prepared as a transparent conductive oxide layer.

Meanwhile, the first to third metal layers 19, 29 and 39 may be formed after the first insulating layer 41, the first contact part 43, the second insulating layer 43 and the second contact part 53 have been formed.

Figure 5:
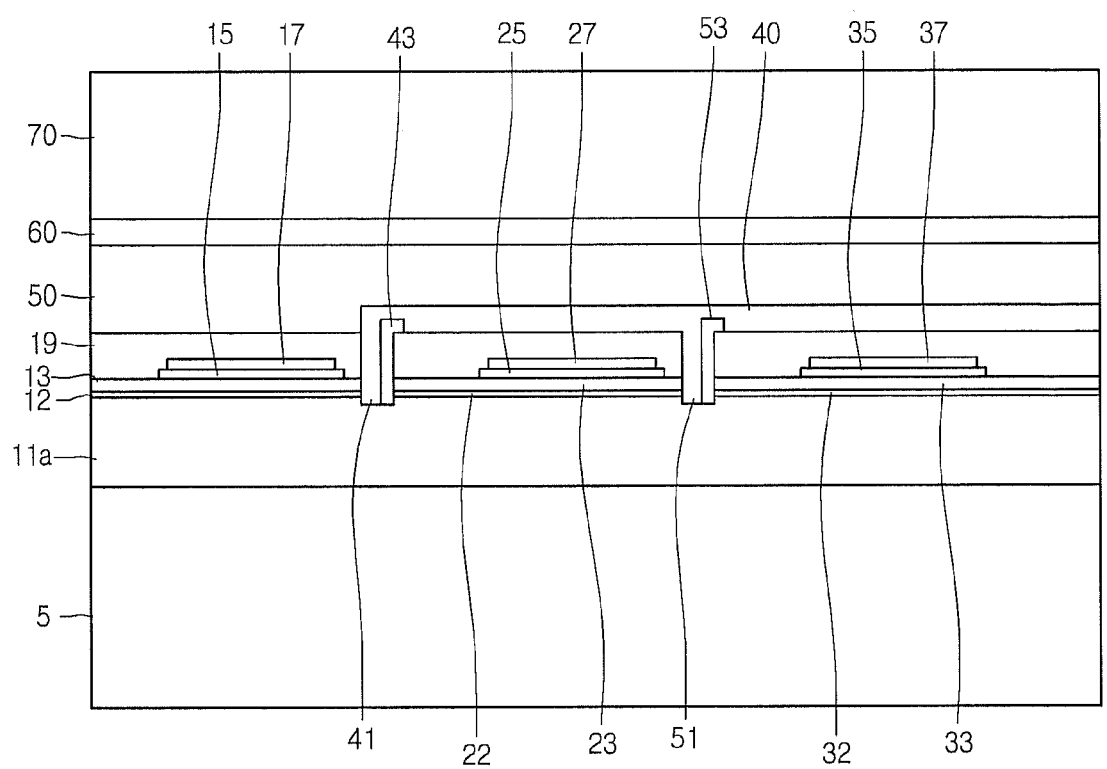

Then, as shown in FIG. 5, the diffusion barrier layer 50, the bonding layer 60 and the support member 70 are formed on the first metal layer 19 and the third insulating layer 40.

When the bonding layer 60 is formed, the diffusion barrier layer 50 may prevent materials included in the bonding layer 60 from diffusing toward the first reflective electrode 17. In detail, the diffusion barrier layer 50 may prevent the materials included in the bonding layer 60, such as Sn, from exerting an influence upon the first reflective electrode 17. The diffusion barrier layer 50 may comprise at least one of Cu, Ni, Ti—W, W and Pt.

The bonding layer 60 may comprise a barrier metal or a bonding metal. For instance, the bonding layer 60 may comprise at least one of Ti, Au, Sn, Ni, Cr, Ga, In, Bi, Cu, Ag and Ta. The support member 70 supports the light emitting device according to the embodiment and is electrically connected to an external electrode to supply power to the first reflective electrode 17.

For instance, the support member 70 may comprise at least one selected from the group consisting of Ti, Cr, Ni, Al, Pt, Au, W, Cu, Mo, Cu—W and a semiconductor substrate doped with impurities (i.e., Si, Ge, GaN, GaAs, ZnO, SiC, or SiGe). The support member 70 may comprise an insulating material. For instance, the support member 70 may comprise $Al_2O_3$ or $SiO_2$.

Then, the growth substrate 5 is removed from the first conductive type semiconductor layer 11a. For example, the growth substrate 5 can be removed through the laser lift off (LLO) process. According to the LLO process, the laser is irradiated onto the bottom of the growth substrate 5 to delaminate the growth substrate 5 from the first conductive type semiconductor layer 11a.

Figure 6:
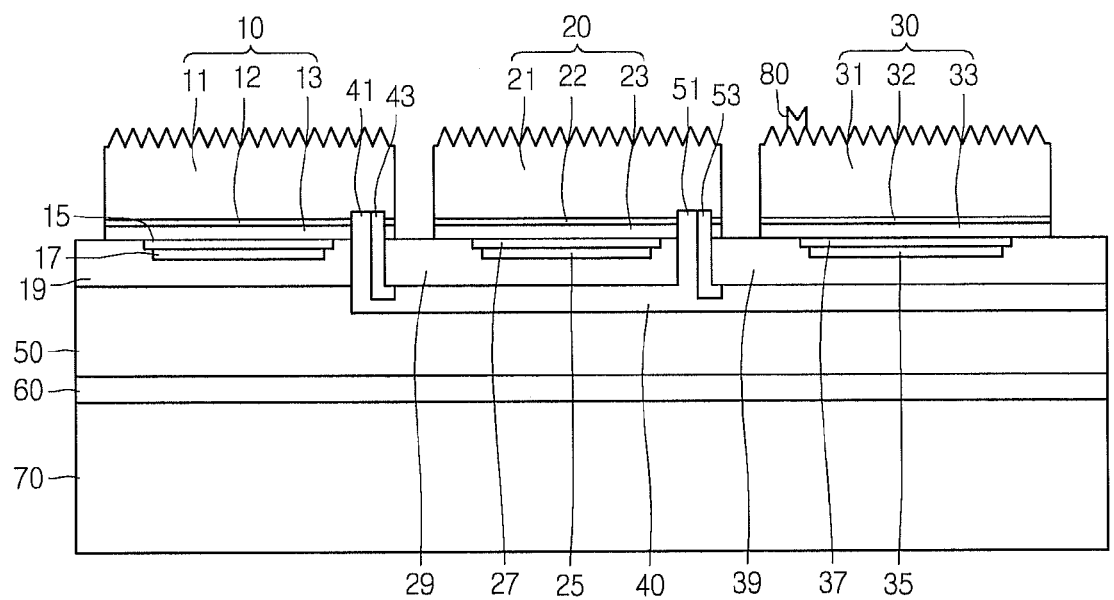

After that, as shown in FIG. 6, an isolation etching process is performed to isolate the first to third light emitting structures 10, 20 and 30 from each other. The isolation etching process may comprise a dry etching process, such as an ICP (inductively coupled plasma) process, but the embodiment is not limited thereto. The first to third metal layers 19, 29 and 39 are partially exposed through the isolation etching process. The first to third metal layers 19, 29 and 39 may serve as etching stoppers.

Light extracting patterns may be formed on the top surfaces of the first to third light emitting structures 10, 20 and 30. In detail, concavo-convex patterns are formed on the top surfaces of the first to third light emitting structures 10, 20 and 30. Therefore, according to the embodiment, the light extraction efficiency can be improved.

The electrode 80 may be disposed on the first conductive type fifth semiconductor layer 31. The electrode 80 is electrically connected to the first conductive type fifth semiconductor layer 31. The electrode 80 makes contact with the top surface of the first conductive type fifth semiconductor layer 31.

Therefore, the power is supplied to the first to third light emitting structures 10, and 30 through the electrode 80 and the first reflective electrode 17. The first to third light emitting structures 10, 20 and 30 are connected with each other in series. Thus, as the power is applied through the electrode 80 and the first reflective electrode 17, the first to third light emitting structures 10, 20 and 30 may emit the light.

According to the embodiment, the electrode 80 may have a multi-layer structure. For instance, the electrode 80 may comprise an ohmic contact layer, an intermediate layer and an upper layer. The ohmic contact layer may comprise one selected from the group consisting of Cr, V, W, Ti, and Zn in order to realize the ohmic contact. The intermediate layer may comprise one selected from the group consisting of Ni, Cu and Al. The upper layer may comprise Au.

A protective layer may be formed on the first to third light emitting structures 10, 20 and 30. The protective layer may comprise oxide or nitride. For instance, the protective layer may comprise a transmittive and insulating material, such as $SiO_2$, $SiO_x$, $SiO_xN_y$, $Si_3N_4$, or $Al_2O_3$. The protective layer may be disposed around the first and third light emitting structures 10 and 30.

According to the embodiment, adjacent light emitting structures can be electrically connected with each other in series through the first and second contact parts 43 and 53. The first light emitting structure 10 may be spaced apart from the second light emitting structure 20. The second metal layer 29 may be exposed between the first and second light emitting structures 10 and 20. In addition, the second light emitting structure 20 may be spaced apart from the third light emitting structure 30. The third metal layer 39 may be exposed between the second and third light emitting structures 20 and 30. The interval between the first and second light emitting structures 10 and 20 and the interval between second and third light emitting structures 20 and 30 may be within 10 micrometers. Thus, according to the embodiment, an etched region of the light emitting structures may be diminished, so that the light emitting performance can be improved.

In the light emitting device according to the embodiment, a plurality of light emitting structures are electrically connected with each other in series and high voltage can be applied to the light emitting device. In addition, since the insulating layer is not formed among the light emitting structures, the light emitting structures can be prevented from being damaged caused by thermal deformation of the insulating layer. Thus, the light emitting device according to the embodiment may have relatively high reliability.

Figure 7:
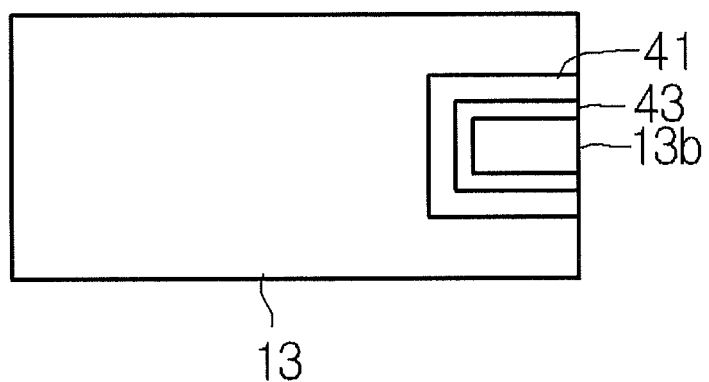

Meanwhile, as shown in FIG. 7, a first region 13b of the second conductive type second semiconductor layer 13 may be isolated by the first contact part 43 when viewed from the top. In addition, the first contact part 43 is electrically insulated from the second conductive type second semiconductor layer 13 by the first insulating layer 41. The first insulating layer 41 may surround the first contact part 43 in the second conductive type second semiconductor layer 13.

Figure 8:
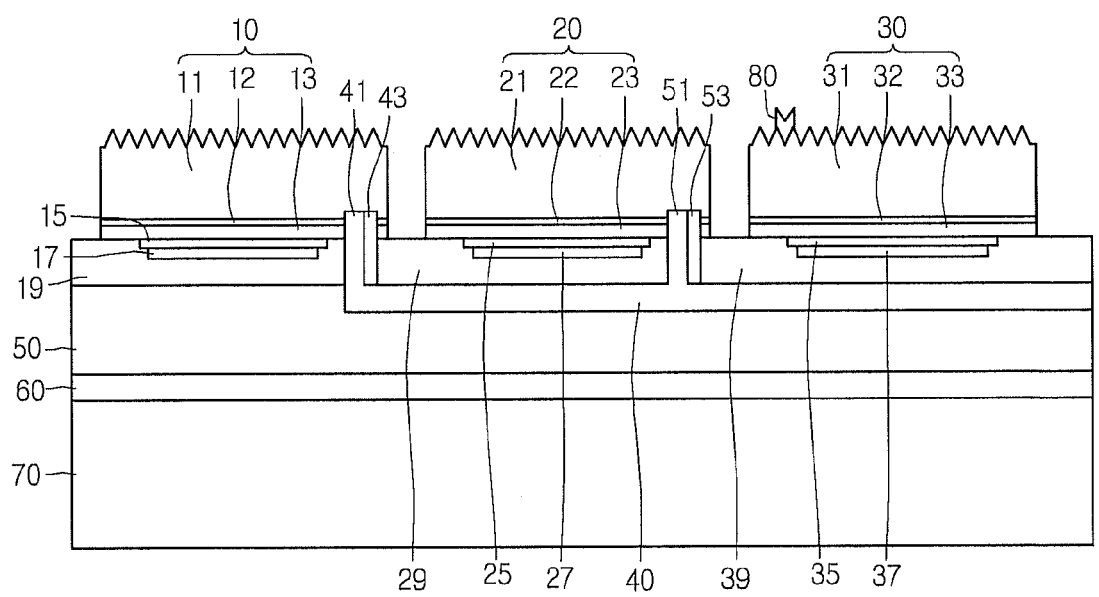
FIGS. 8 to 11 are views showing modified examples of a light emitting device according to the embodiment.

FIG. 8 is a view showing a light emitting device according to another embodiment. In the following description, the description about the elements and structures that have been described with reference to FIG. 1 will be omitted in order to avoid redundancy.

A first contact part 43 may be disposed under the first light emitting structure 10. The first contact part 43 electrically connects the first conductive type first semiconductor layer 11 to the second reflective electrode 27. The first contact part 43 makes contact with an inner portion of the first conductive type first semiconductor layer 11. The first contact part 43 makes contact with a lateral side of the second metal layer 29. The first contact part 43 is electrically connected to the second ohmic contact layer 25, the second reflective electrode 27 and the second conductive type fourth semiconductor layer 23. The first conductive type first semiconductor layer 11 is electrically connected to the second conductive type fourth semiconductor layer 23 through the first contact part 43.

For instance, the first contact part 43 may comprise at least one selected from the group consisting of Cr, Al, Ti, Ni, Pt, and V. In addition, the first contact part 43 may comprise a transparent conductive oxide layer. In detail, the first contact part 43 may comprise at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, and NiO.

The first contact part 43 can make contact with the inner portion of the first conductive type first semiconductor layer 11. For instance, the first conductive type first semiconductor layer 11 may comprise a GaN layer. When taking the growing direction and etching direction of the semiconductor layer into consideration, the first contact part 43 makes contact with a Ga face of the first conductive type first semiconductor layer 11. According to the embodiment, since the first contact part 43 makes contact with the Ga face of the first conductive type first semiconductor layer 11, the thermal stability can be ensured as compared with the case in which the first contact part 43 makes contact with an N face of the first conductive type first semiconductor layer 11. In addition, according to the embodiment, since the first contact part 43 makes contact with the Ga face of the first conductive type first semiconductor layer 11, variation of the characteristic curve according to the operating voltage may be diminished as compared with the case in which the first contact part 43 makes contact with an N face of the first conductive type first semiconductor layer 11, so that the reliability can be improved and high current application is possible.

A first insulating layer 41 may be disposed between the first contact part 43 and the second conductive type second semiconductor layer 13. The first insulating layer 41 may be disposed between the first contact part 43 and the first active layer 12. For instance, the first insulating layer 41 may comprise a transmittive and insulating material, such as $SiO_2$, $SiO_x$, $SiO_xN_y$, $Si_3N_4$, $Al_2O_3$, $TiO_2$, or AlN.

A second contact part 53 may be disposed under the second light emitting structure 20. The second contact part 53 electrically connects the first conductive type third semiconductor layer 21 to the third reflective electrode 37. The second contact part 53 makes contact with an inner portion of the first conductive type third semiconductor layer 21. The second contact part 53 makes contact with a lateral side of the third metal layer 39. The second contact part 53 is electrically connected to the third ohmic contact layer 35, the third reflective electrode 37 and the second conductive type sixth semiconductor layer 33. The first conductive type third semiconductor layer 21 is electrically connected to the second conductive type sixth semiconductor layer 33 through the second contact part 53.

For instance, the second contact part 53 may comprise at least one selected from the group consisting of Cr, Al, Ti, Ni, Pt, and V. In addition, the second contact part 53 may comprise a transparent conductive oxide layer. In detail, the second contact part 53 may comprise at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, and NiO.

The second contact part 53 can make contact with the inner portion of the first conductive type third semiconductor layer 21. For instance, the first conductive type third semiconductor layer 21 may comprise a GaN layer. When taking the growing direction and etching direction of the semiconductor layer into consideration, the second contact part 53 makes contact with a Ga face of the first conductive type third semiconductor layer 21. According to the embodiment, since the second contact part 53 makes contact with the Ga face of the first conductive type third semiconductor layer 21, the thermal stability can be ensured as compared with the case in which the second contact part 53 makes contact with an N face of the first conductive type third semiconductor layer 21. In addition, according to the embodiment, since the second contact part 53 makes contact with the Ga face of the first conductive type third semiconductor layer 21, variation of the characteristic curve according to the operating voltage may be diminished as compared with the case in which the second contact part 53 makes contact with an N face of the first conductive type third semiconductor layer 21, so that the reliability can be improved and high current application is possible.

A second insulating layer 51 may be disposed between the second contact part 53 and the second conductive type fourth semiconductor layer 23. The second insulating layer 51 may be disposed between the second contact part 53 and the second active layer 22. For instance, the second insulating layer 51 may comprise a transmittive and insulating material, such as $SiO_2$, $SiO_x$, $SiO_xN_y$, $Si_3N_4$, $Al_2O_3$, $TiO_2$, or AlN.

Figure 9:
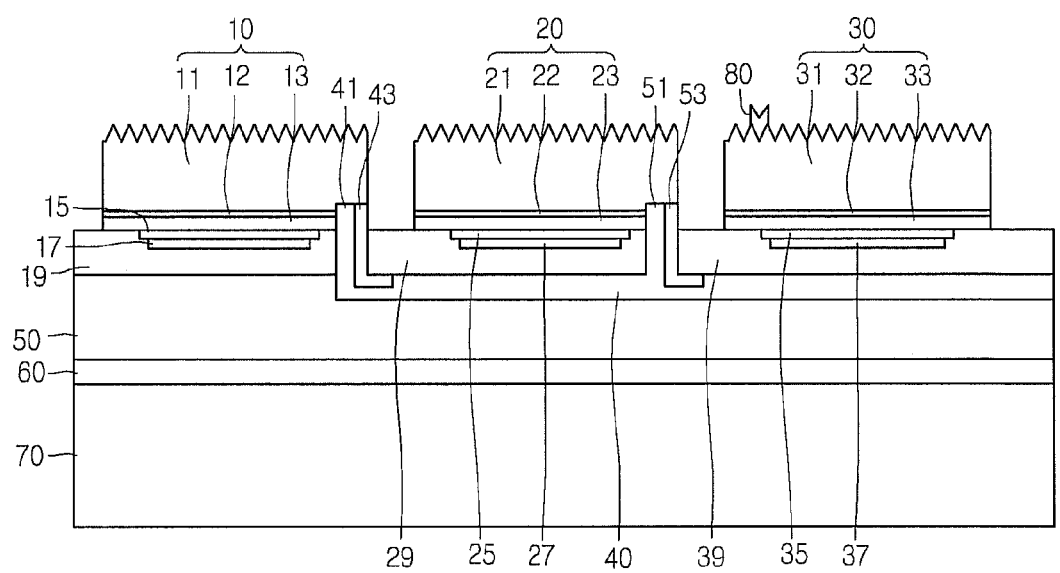

FIG. 9 is a view showing a light emitting device according to still another embodiment. In the following description, the description about the elements and structures that have been described with reference to FIG. 1 will be omitted in order to avoid redundancy.

A first contact part 43 may be disposed under the first light emitting structure 10. The first contact part 43 electrically connects the first conductive type first semiconductor layer 11 to the second reflective electrode 27. The first contact part makes contact with an inner portion of the first conductive type first semiconductor layer 11. The first contact part 43 makes contact with a lower portion of the second metal layer 29. The first contact part 43 makes contact with a lateral side of the second metal layer 29. The first contact part 43 can be electrically connected to the second reflective electrode 27, the second ohmic contact layer 25 and the second conductive type fourth semiconductor layer 23. Thus, the first conductive type first semiconductor layer 11 is electrically connected to the second conductive type fourth semiconductor layer 23 through the first contact part 43.

A first region of the first contact part 43 may be exposed between the first light emitting structure 10 and the second light emitting structure 20. In addition, the second metal layer 29 is partially exposed between the first light emitting structure 10 and the second light emitting structure 20.

For instance, the first contact part 43 may comprise at least one selected from the group consisting of Cr, Al, Ti, Ni, Pt, and V. In addition, the first contact part 43 may comprise a transparent conductive oxide layer. In detail, the first contact part 43 may comprise at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, and NiO.

The first contact part 43 can make contact with the inner portion of the first conductive type first semiconductor layer 11. For instance, the first conductive type first semiconductor layer 11 may comprise a GaN layer. When taking the growing direction and etching direction of the semiconductor layer into consideration, the first contact part 43 makes contact with a Ga face of the first conductive type first semiconductor layer 11. According to the embodiment, since the first contact part 43 makes contact with the Ga face of the first conductive type first semiconductor layer 11, the thermal stability can be ensured as compared with the case in which the first contact part 43 makes contact with an N face of the first conductive type first semiconductor layer 11. In addition, according to the embodiment, since the first contact part 43 makes contact with the Ga face of the first conductive type first semiconductor layer 11, variation of the characteristic curve according to the operating voltage may be diminished as compared with the case in which the first contact part 43 makes contact with an N face of the first conductive type first semiconductor layer 11, so that the reliability can be improved and high current application is possible.

A first insulating layer 41 may be disposed between the first contact part 43 and the second conductive type second semiconductor layer 13. The first insulating layer 41 may be disposed between the first contact part 43 and the first active layer 12. For instance, the first insulating layer 41 may comprise a transmittive and insulating material, such as $SiO_2$, $SiO_x$, $SiO_xN_y$, $Si_3N_4$, $Al_2O_3$, $TiO_2$ or AlN.

A second contact part 53 may be disposed under the second light emitting structure 20. The second contact part 53 electrically connects the first conductive type third semiconductor layer 21 with the third reflective electrode 37. The second contact part 53 makes contact with an inner portion of the first conductive type third semiconductor layer 21. The second contact part 53 makes contact with a lower portion of the third metal layer 39. The second contact part 53 makes contact with a lateral side of the third metal layer 39. The second contact part 53 can be electrically connected to the third reflective electrode 37, the third ohmic contact layer 35 and the second conductive type sixth semiconductor layer 33. Thus, the first conductive type third semiconductor layer 21 is electrically connected to the second conductive type sixth semiconductor layer 33 through the second contact part 53.

A first region of the second contact part 53 may be exposed between the second light emitting structure 20 and the third light emitting structure 30. In addition, the third metal layer 39 is partially exposed between the second light emitting structure 20 and the third light emitting structure 30.

For instance, the second contact part 53 may comprise at least one selected from the group consisting of Cr, Al, Ti, Ni, Pt, and V. In addition, the second contact part 53 may comprise a transparent conductive oxide layer. In detail, the second contact part 53 may comprise at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, and NiO.

The second contact part 53 can make contact with the inner portion of the first conductive type third semiconductor layer 21. For instance, the first conductive type third semiconductor layer 21 may comprise a GaN layer. When taking the growing direction and etching direction of the semiconductor layer into consideration, the second contact part 53 makes contact with a Ga face of the first conductive type third semiconductor layer 21. According to the embodiment, since the second contact part 53 makes contact with the Ga face of the first conductive type third semiconductor layer 21, the thermal stability can be ensured as compared with the case in which the second contact part 53 makes contact with an N face of the first conductive type third semiconductor layer 21. In addition, according to the embodiment, since the second contact part 53 makes contact with the Ga face of the first conductive type third semiconductor layer 21, variation of the characteristic curve according to the operating voltage may be diminished as compared with the case in which the second contact part 53 makes contact with an N face of the first conductive type third semiconductor layer 21, so that the reliability can be improved and high current application is possible.

A second insulating layer 51 may be disposed between the second contact part 53 and the second conductive type fourth semiconductor layer 23. The second insulating layer 51 may be disposed between the second contact part 53 and the second active layer 22. For instance, the second insulating layer 51 may comprise a transmittive and insulating material, such as $SiO_2$, $SiO_x$, $SiO_xN_y$, $Si_3N_4$, $Al_2O_3$, $TiO_2$ or AlN.

Figure 10:
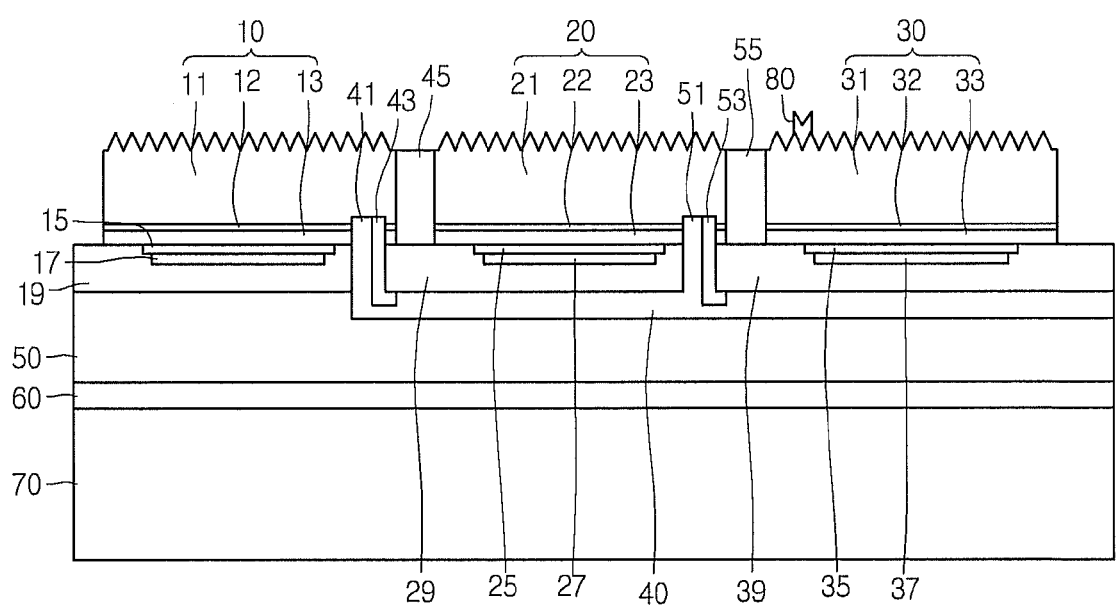

FIG. 10 is a view showing a light emitting device according to still another embodiment. In the following description, the description about the elements and structures that have been described with reference to FIG. 1 will be omitted in order to avoid redundancy.

A first contact part 43 may be disposed under the first light emitting structure 10. The first contact part 43 electrically connects the first conductive type first semiconductor layer 11 to the second reflective electrode 27. The first contact part makes contact with an inner portion of the first conductive type first semiconductor layer 11. The first contact part 43 makes contact with a lower portion of the second metal layer 29. The first contact part 43 makes contact with a lateral side of the second metal layer 29. The first contact part 43 can be electrically connected to the second reflective electrode 27, the second ohmic contact layer 25 and the second conductive type fourth semiconductor layer 23. Thus, the first conductive type first semiconductor layer 11 is electrically connected to the second conductive type fourth semiconductor layer 23 through the first contact part 43.

For instance, the first contact part 43 may comprise at least one selected from the group consisting of Cr, Al, Ti, Ni, Pt, and V. In addition, the first contact part 43 may comprise a transparent conductive oxide layer. In detail, the first contact part 43 may comprise at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, and NiO.

The first contact part 43 can make contact with the inner portion of the first conductive type first semiconductor layer 11. For instance, the first conductive type first semiconductor layer 11 may comprise a GaN layer. When taking the growing direction and etching direction of the semiconductor layer into consideration, the first contact part 43 makes contact with a Ga face of the first conductive type first semiconductor layer 11. According to the embodiment, since the first contact part 43 makes contact with the Ga face of the first conductive type first semiconductor layer 11, the thermal stability can be ensured as compared with the case in which the first contact part 43 makes contact with an N face of the first conductive type first semiconductor layer 11. In addition, according to the embodiment, since the first contact part 43 makes contact with the Ga face of the first conductive type first semiconductor layer 11, variation of the characteristic curve according to the operating voltage may be diminished as compared with the case in which the first contact part 43 makes contact with an N face of the first conductive type first semiconductor layer 11, so that the reliability can be improved and high current application is possible.

A first insulating layer 41 may be disposed between the first contact part 43 and the second conductive type second semiconductor layer 13. The first insulating layer 41 may be disposed between the first contact part 43 and the first active layer 12. For instance, the first insulating layer 41 may comprise a transmittive and insulating material, such as $SiO_2$, $SiO_x$, $SiO_xN_y$, $Si_3N_4$, $Al_2O_3$, $TiO_2$ or AlN.

A second contact part 53 may be disposed under the second light emitting structure 20. The second contact part 53 electrically connects the first conductive type third semiconductor layer 21 with the third reflective electrode 37. The second contact part 53 makes contact with an inner portion of the first conductive type third semiconductor layer 21. The second contact part 53 makes contact with a lower portion of the third metal layer 39. The second contact part 53 makes contact with a lateral side of the third metal layer 39. The second contact part 53 can be electrically connected to the third reflective electrode 37, the third ohmic contact layer 35 and the second conductive type sixth semiconductor layer 33. Thus, the first conductive type third semiconductor layer 21 is electrically connected to the second conductive type sixth semiconductor layer 33 through the second contact part 53.

For instance, the second contact part 53 may comprise at least one selected from the group consisting of Cr, Al, Ti, Ni, Pt, and V. In addition, the second contact part 53 may comprise a transparent conductive oxide layer. In detail, the second contact part 53 may comprise at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, and NiO.

The second contact part 53 can make contact with the inner portion of the first conductive type third semiconductor layer 21. For instance, the first conductive type third semiconductor layer 21 may comprise a GaN layer. When taking the growing direction and etching direction of the semiconductor layer into consideration, the second contact part 53 makes contact with a Ga face of the first conductive type third semiconductor layer 21. According to the embodiment, since the second contact part 53 makes contact with the Ga face of the first conductive type third semiconductor layer 21, the thermal stability can be ensured as compared with the case in which the second contact part 53 makes contact with an N face of the first conductive type third semiconductor layer 21. In addition, according to the embodiment, since the second contact part 53 makes contact with the Ga face of the first conductive type third semiconductor layer 21, variation of the characteristic curve according to the operating voltage may be diminished as compared with the case in which the second contact part 53 makes contact with an N face of the first conductive type third semiconductor layer 21, so that the reliability can be improved and high current application is possible.

A second insulating layer 51 may be disposed between the second contact part 53 and the second conductive type fourth semiconductor layer 23. The second insulating layer 51 may be disposed between the second contact part 53 and the second active layer 22. For instance, the second insulating layer 51 may comprise a transmittive and insulating material, such as $SiO_2$, $SiO_x$, $SiO_xN_y$, $Si_3N_4$, $Al_2O_3$, $TiO_2$ or AlN.

A fourth insulating layer 45 may be disposed between the first and second light emitting structures 10 and 20. The fourth insulating layer 45 makes contact with the second metal layer 29. The fourth insulating layer 45 electrically insulates the first conductive type first semiconductor layer 11 from the first conductive type third semiconductor layer 21. A fifth insulating layer 55 may be disposed between the second and third light emitting structures 20 and 30. The fifth insulating layer 55 makes contact with the third metal layer 39. The fifth insulating layer 55 electrically insulates the first conductive type third semiconductor layer 21 from the first conductive type fifth semiconductor layer 31. For instance, the fourth and fifth insulating layers 45 and 55 may be prepared as insulating ion layers. The fourth and fifth insulating layers 45 and 55 may be formed through the ion implantation process. The fourth and fifth insulating layers 45 and 55 may comprise at least one of N and O.

Figure 11:
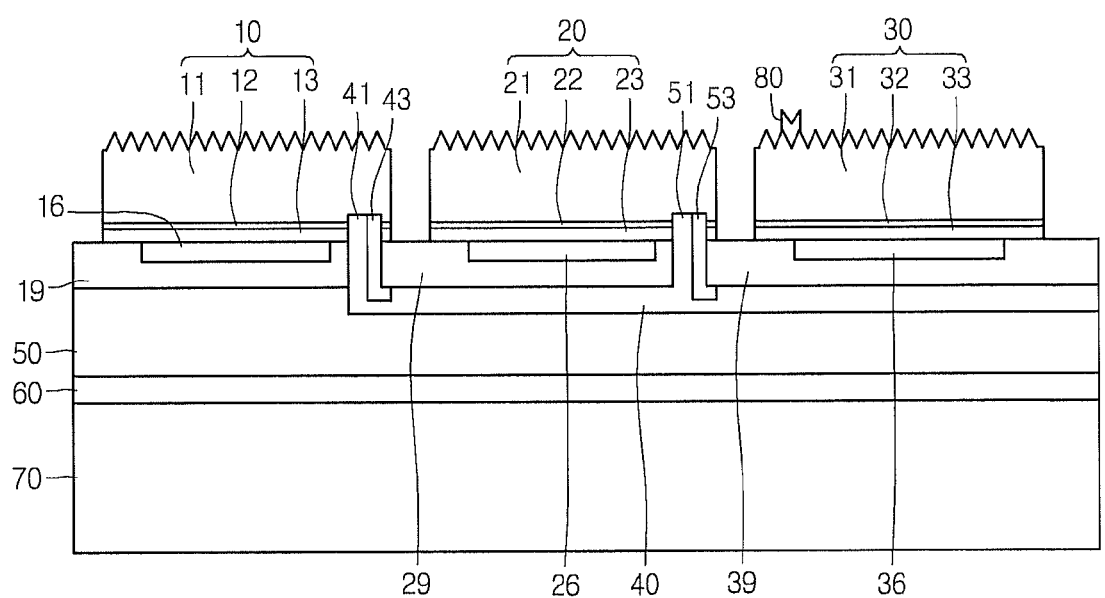

FIG. 11 is a view showing a light emitting device according to still another embodiment. In the following description, the description about the elements and structures that have been described with reference to FIG. 1 will be omitted in order to avoid redundancy.

According to the light emitting device of the embodiment, a first ohmic reflective electrode 16 may be disposed under the first light emitting structure 10. The first ohmic reflective electrode 16 may be prepared to perform the function of both first reflective electrode 17 and first ohmic contact layer 15 that have been described with reference to FIG. 1. Thus, the first ohmic reflective electrode 16 makes ohmic-contact with the second conductive type second semiconductor layer 13 and reflects the light incident from the first light emitting structure 10.

In addition, a second ohmic reflective electrode 26 may be disposed under the second light emitting structure 20. The second ohmic reflective electrode 26 may be prepared to perform the function of both second reflective electrode 27 and second ohmic contact layer 25 that have been described with reference to FIG. 1. Thus, the second ohmic reflective electrode 26 makes ohmic-contact with the second conductive type fourth semiconductor layer 23 and reflects the light incident from the second light emitting structure 20.

Further, a third ohmic reflective electrode 36 may be disposed under the third light emitting structure 30. The third ohmic reflective electrode 36 may be prepared to perform the function of both third reflective electrode 37 and third ohmic contact layer 35 that have been described with reference to FIG. 1. Thus, the third ohmic reflective electrode 36 makes ohmic-contact with the second conductive type sixth semiconductor layer 33 and reflects the light incident from the third light emitting structure 30.

Figure 12:
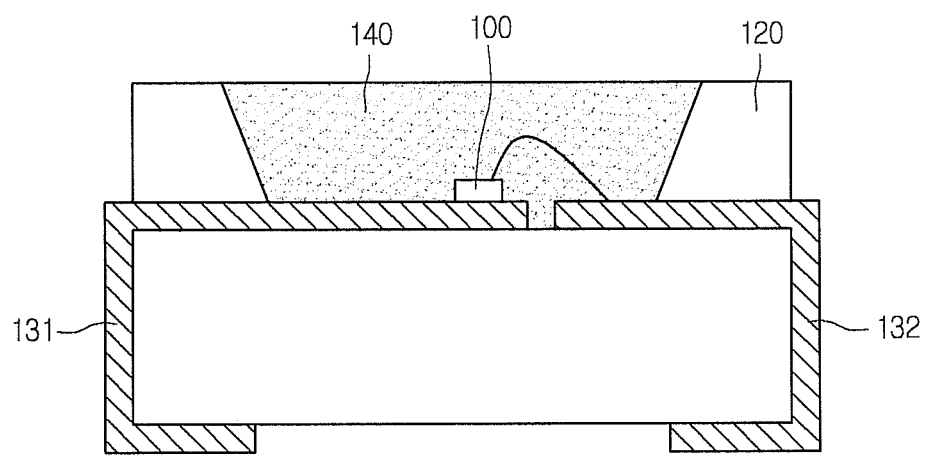
FIG. 12 is a view showing a light emitting device package according to the embodiment.

FIG. 12 is a view showing a light emitting device package comprising a light emitting device according to the embodiment.

Referring to FIG. 12, the light emitting device package comprises a body 120, first and second lead electrodes 131 and 132 formed on the body 120, the light emitting device 100 according to the embodiment, which is installed in the body 120 and electrically connected to the first and second lead electrodes 131 and 132, and a molding member 140 surrounding the light emitting device 100.

The body 120 may comprise silicon, synthetic resin, or metallic material. An inclined surface may be formed around the light emitting device 100.

The first and second lead electrodes 131 and 132 are electrically insulated from each other and supply power to the light emitting device 100. The first and second lead electrodes 131 and 132 may reflect light emitted from the light emitting device 100 to increase light efficiency, and may dissipate heat generated from the light emitting device 100 to the outside.

The light emitting device 100 may be mounted on the body 120 or on the first or second lead electrode 131 or 132.

The light emitting device 100 may be electrically connected with the first and second lead electrode 131 and 132 through one of a wire scheme, a flip chip scheme and a die bonding scheme.

The molding member 140 may protect the light emitting device 100 by surrounding the light emitting device 100. In addition, the molding member 140 may comprise phosphors to change the wavelength of light emitted from the light emitting device 100.

A plurality of light emitting devices according to the embodiment of a plurality of light emitting device packages may be arrayed on the board. In addition, optical members, such as a lens, a light guide plate, a prism sheet and a diffusion sheet, may be installed in an optical path of the light emitting device package. The light emitting device package, the board and the optical members may serve as a light unit. A top view type light unit or a side view type light unit can be provided in a display device, such as a portable terminal or a notebook computer. According to another embodiment, there is provided a lighting device comprising the light emitting device or the light emitting device package according to the embodiments. For instance, the lighting device may comprise a lamp, a street lamp, an electric sign board or a headlight.

The light emitting device according to the embodiment can be applied to the light unit. The light unit has a structure in which a plurality of light emitting devices is arrayed. The light unit may comprise a display device shown in FIGS. 13 and 14 and a lighting device shown in FIG. 15.

Figure 13:
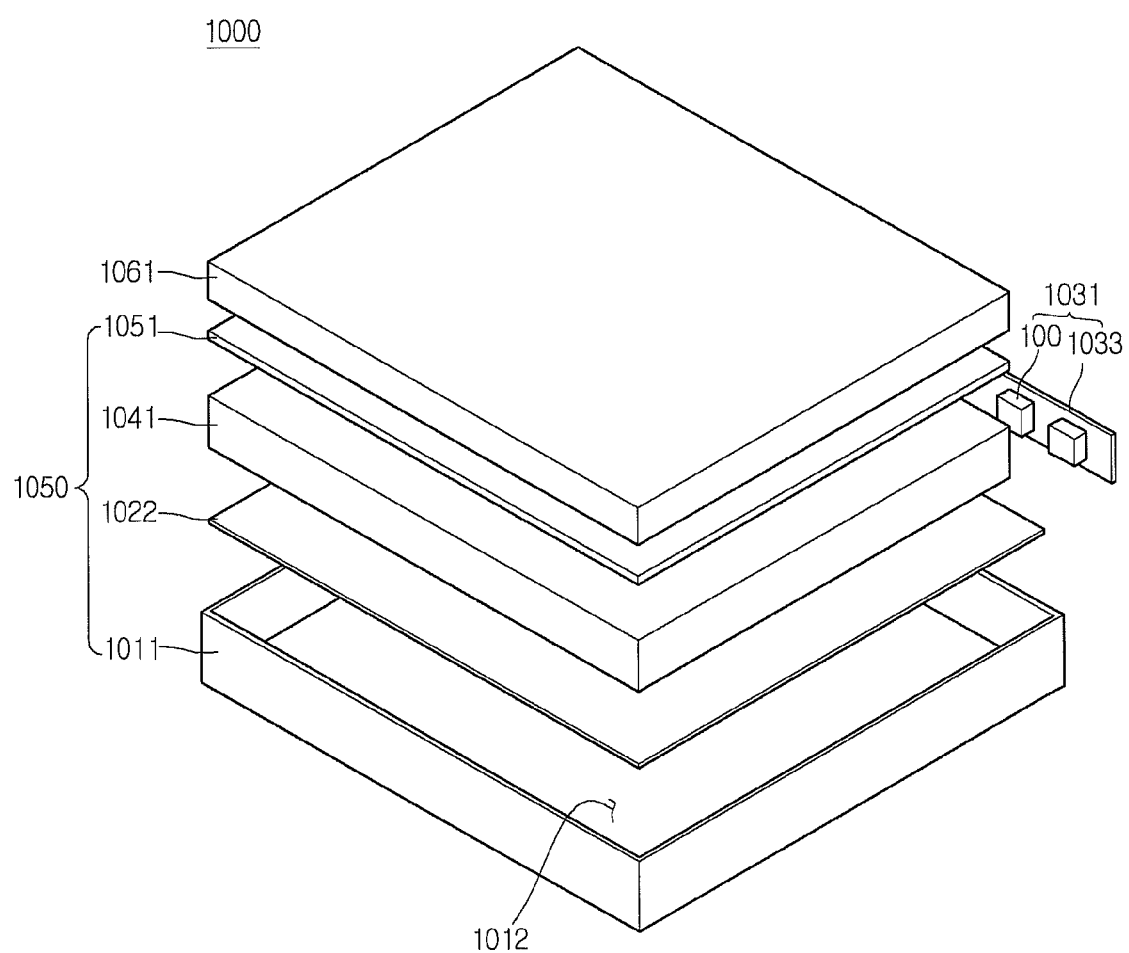
FIG. 13 is a view showing a display device according to the embodiment.

Referring to FIG. 13, the display device 1000 according to the embodiment comprises a light guide plate 1041, a light emitting module 1031 for supplying the light to the light guide plate 1041, a reflective member 1022 under the light guide plate 1041, an optical sheet 1051 on the light guide plate 1041, a display panel 1061 on the optical sheet 1051, and a bottom cover 1011 for receiving the light guide plate 1041, the light emitting module 1031, and the reflective member 1022. However, the embodiment is not limited to the above structure.

The bottom cover 1011, the reflective sheet 1022, the light guide plate 1041 and the optical sheet 1051 may constitute a light unit 1050.

The light guide plate 1041 diffuses the light to provide surface light. The light guide plate 1041 may comprise transparent material. For instance, the light guide plate 1041 may comprise one of acryl-based resin, such as polymethyl methacrylate (PMMA), polyethylene terephthalate (PET), polycarbonate (PC), cyclic olefin copolymer (COC) and polyethylene naphthalate (PEN) resin.

The light emitting module 1031 supplies the light to at least one side of the light guide plate 1041 and serves as the light source of the display device.

At least one light emitting module 1031 is provided to directly or indirectly supply the light from the lateral side of the light guide plate 1041. The light emitting module 1031 may comprise a board 1033 and light emitting devices 100 according to the embodiments. The light emitting devices 100 are arrayed on the board 1033 while being spaced apart from each other at the predetermined interval.

The board 1033 may comprise a printed circuit board (PCB) having a circuit pattern. In addition, the board 1033 may also comprise a metal core PCB (MCPCB) or a flexible PCB (FPCB) as well as a typical PCB, but the embodiment is not limited thereto. If the light emitting devices 100 are installed on the lateral side of the bottom cover 1011 or on a heat dissipation plate, the board 1033 may be omitted. The heat dissipation plate partially makes contact with the top surface of the bottom cover 1011.

In addition, the light emitting devices 100 are arranged such that light exit surfaces of the light emitting devices 100 are spaced apart from the light guide plate 1041 by a predetermined distance, but the embodiment is not limited thereto. The light emitting devices 100 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which travels downward through the bottom surface of the light guide plate 1041, toward the light guide plate 1041, thereby improving the brightness of the light unit 1050. For instance, the reflective member 1022 may comprise PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an open top surface, but the embodiment is not limited thereto. The bottom cover 1011 can be coupled with the top cover, but the embodiment is not limited thereto.

The bottom cover 1011 can be manufactured through a press process or an extrusion process by using metallic material or resin material. In addition, the bottom cover 1011 may comprise metal or non-metallic material having superior thermal conductivity, but the embodiment is not limited thereto.

The display panel 1061, for instance, is an LCD panel comprising transparent first and second substrates, which are opposite to each other, and a liquid crystal layer interposed between the first and second substrates. A polarizing plate can be attached to at least one surface of the display panel 1061, but the embodiment is not limited thereto. The display panel 1061 displays information based on the light that has passed through the optical sheet 1051. The display device 1000 can be applied to various portable terminals, monitors of laptop computers, and televisions.

The optical sheet 1051 is disposed between the display panel 1061 and the light guide plate 1041 and comprises at least one transmissive sheet. For instance, the optical sheet 1051 comprises at least one of a diffusion sheet, a horizontal and vertical prism sheet, and a brightness enhancement sheet. The diffusion sheet diffuses the incident light, the horizontal and vertical prism sheet concentrates the incident light onto the display region, and the brightness enhancement sheet improves the brightness by reusing the lost light. In addition, a protective sheet can be provided on the display panel 1061, but the embodiment is not limited thereto.

The light guide plate 1041 and the optical sheet 1051 can be provided on the optical path of the light emitting module 1031 as optical members, but the embodiment is not limited thereto.

Figure 14:
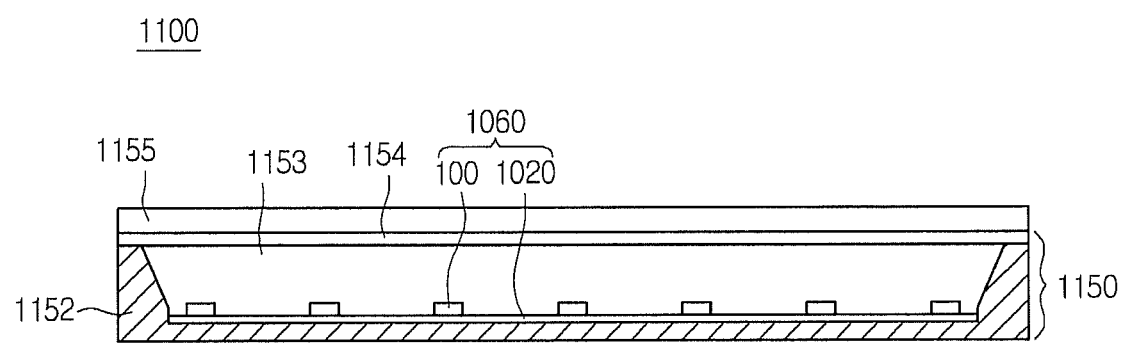
FIG. 14 is a view showing a display device according to another embodiment.

FIG. 14 is a sectional view showing a display device according to another embodiment.

Referring to FIG. 14, the display device 1100 comprises a bottom cover 1152, a board 1020 on which the light emitting devices 100 are arrayed, an optical member 1154, and a display panel 1155.

The board 1020 and the light emitting devices 100 may constitute the light emitting module 1060. In addition, the bottom cover 1152, at least one light emitting module 1060, and the optical member 1154 may constitute the light unit.

The bottom cover 1151 can be provided therein with a receiving section 1153, but the embodiment is not limited thereto.

The optical member 1154 may comprise at least one of a lens, a light guide plate, a diffusion sheet, a horizontal and vertical prism sheet, and a brightness enhancement sheet. The light guide plate may comprise PC or poly methyl methacrylate (PMMA). The light guide plate can be omitted. The diffusion sheet diffuses the incident light, the horizontal and vertical prism sheet concentrates the incident light onto the display region, and the brightness enhancement sheet improves the brightness by reusing the lost light.

The optical member 1154 is disposed above the light emitting module 1060 in order to convert the light emitted from the light emitting module 1060 into the surface light. In addition, the optical member 1154 may diffuse or collect the light.

Figure 15:
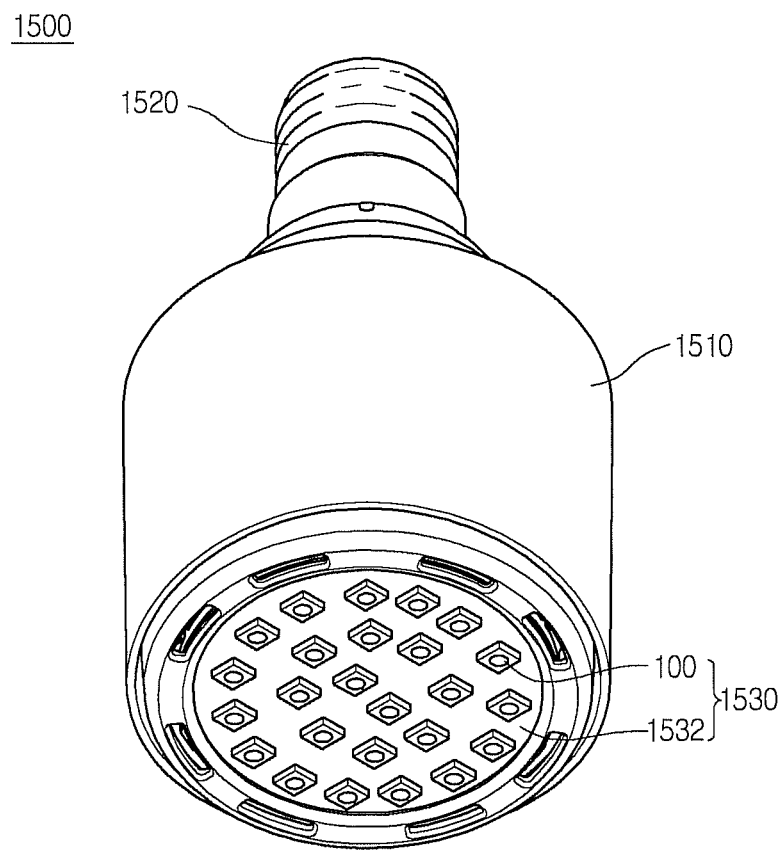
FIG. 15 is a view showing a lighting device according to the embodiment.

FIG. 15 is a perspective view showing a lighting device according to the embodiment.

Referring to FIG. 15, the lighting device 1500 comprises a case 1510, a light emitting module 1530 installed in the case 1510, and a connection terminal 1520 installed in the case 1510 to receive power from an external power source.

Preferably, the case 1510 comprises material having superior heat dissipation property. For instance, the case 1510 comprises metallic material or resin material.

The light emitting module 1530 may comprise a board 1532 and light emitting devices 100 according to the embodiment installed on the board 1532. The light emitting devices 100 are spaced apart from each other or arranged in the form of a matrix.

The board 1532 comprises an insulating member printed with a circuit pattern. For instance, the board 1532 comprises a PCB, an MCPCB, an FPCB, a ceramic PCB, and an FR-4 board.

In addition, the board 1532 may comprise material that effectively reflects the light. A coating layer can be formed on the surface of the board 1532. At this time, the coating layer has a white color or a silver color to effectively reflect the light.

At least one light emitting device 100 is installed on the board 1532. Each light emitting device 100 may comprise at least one LED (light emitting diode) chip. The LED chip may comprise an LED that emits the light of visible ray band having red, green, blue or white color and a UV (ultraviolet) LED that emits UV light.

The light emitting devices 100 of the light emitting module 1530 can be variously arranged to provide various colors and brightness. For instance, the white LED, the red LED and the green LED can be arranged to achieve the high color rendering index (CRI).

The connection terminal 1520 is electrically connected to the light emitting module 1530 to supply power to the light emitting module 1530. The connection terminal 1520 has a shape of a socket screw-coupled with the external power source, but the embodiment is not limited thereto. For instance, the connection terminal 1520 can be prepared in the form of a pin inserted into the external power source or connected to the external power source through a wire.

According to the embodiment, the light emitting devices 100 are packaged and then mounted on the board to provide the light emitting module. In addition, the light emitting devices are mounted in the form of the LED chip and then packaged to form the light emitting module.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a conductive support substrate;
   a first light emitting structure disposed on the conductive support substrate and comprising a first conductive type first semiconductor layer, a first active layer under the first conductive type first semiconductor layer, and a second conductive type second semiconductor layer under the first active layer;
   a first reflective electrode under the first light emitting structure;
   a first metal layer surrounding side surfaces of the first reflective electrode, the first metal layer directly and physically contacting a bottom surface of the first reflective electrode;
   a second light emitting structure disposed on the conductive support substrate and comprising a first conductive type third semiconductor layer, a second active layer under the first conductive type third semiconductor layer, and a second conductive type fourth semiconductor layer under the second active layer, the second light emitting structure spaced apart from the first light emitting structure;
   a second reflective electrode under the second light emitting structure; a second metal layer surrounding side surfaces of the second reflective electrode, the second metal layer directly and physically contacting a bottom surface of the second reflective electrode;
   a contact part making contact with an inner portion of the first conductive type first semiconductor layer of the first light emitting structure and electrically connected to the second reflective electrode; and
   an insulating layer,
   wherein a top surface of the second metal layer is exposed between the first light emitting structure and the second light emitting structure,
   wherein an end portion of the contact part is directly and physically connected to a bottom surface of the second metal layer,
   wherein a side surface of the contact part is directly and physically contacting a side surface of the second metal layer, and
   wherein the conductive support substrate is electrically connected to a bottom surface of the second conductive type second semiconductor layer, and
   wherein a part of the insulating layer is disposed between the conductive support substrate and the second metal layer, and
   wherein a top surface of the part of the insulating layer directly and physically contacts a bottom surface of the second metal layer.

2. The light emitting device of claim 1, further comprising a first ohmic contact layer disposed between the first reflective electrode and the second conductive type second semiconductor layer, and a second ohmic contact layer disposed between the second reflective electrode and the second conductive type fourth semiconductor layer.

3. The light emitting device of claim 1, wherein the insulating layer is disposed between the contact part and the second conductive type second semiconductor layer and between the contact part and the first active layer.

4. The light emitting device of claim 3, wherein the insulating layer surrounds the contact part in the second conductive type second semiconductor layer.

5. The light emitting device of claim 3, wherein the insulating layer is not vertically overlapped with the first reflective electrode.

6. The light emitting device of claim 1, wherein, when the first conductive type first semiconductor layer comprises a GaN layer, the contact part makes contact with a Ga face of the first conductive type first semiconductor layer.

7. The light emitting device of claim 1, wherein the second metal layer serves as an etching stopper through an isolation etching process to isolate the first light emitting structure from the second light emitting structure.

8. The light emitting device of claim 1, wherein a gap between the first light emitting structure and the second light emitting structure is within about 10 micrometers.

9. The light emitting device of claim 1, wherein the conductive support substrate is configured to be connected to an external electrode to provide an operating voltage for the first light emitting structure from the external electrode.

10. A light emitting device comprising:
    a conductive support substrate;
    a plurality of light emitting cells disposed on the conductive support substrate, each light emitting cell comprising a reflective electrode, a second conductive type semiconductor layer on the reflective electrode, an active layer on the second conductive type semiconductor layer, and a first conductive type semiconductor layer on the active layer;
    a contact part making contact with an inner portion of the first conductive type semiconductor layer of a first light emitting cell and electrically connected to the reflective electrode of a second light emitting cell adjacent to the first light emitting cell;
    a metal layer surrounding side surfaces of the reflective electrode of the second light emitting cell, the metal layer directly and physically contacting a bottom surface of the reflective electrode of the second light emitting cell; and
    an insulating layer,
    wherein a side surface of the contact part directly and physically contacts a side surface of the metal layer,
    wherein the first light emitting cell is spaced apart from the second light emitting cell,
    wherein a top surface of the metal layer is exposed between the first light emitting cell and the second light emitting cell, wherein the metal layer serves as an etching stopper through an isolation etching process to isolate the first light emitting cell from the second light emitting cell, wherein the conductive support substrate is electrically connected to a bottom surface of the second conductive type semiconductor layer of the first light emitting cell, wherein a part of the insulating layer is disposed between the conductive support substrate and the metal layer, and wherein a top surface of the part of the insulating layer directly and physically contacts a bottom surface of the metal layer.

11. The light emitting device of claim 10, wherein a gap between the first light emitting cell and the second light emitting cell is within about 10 micrometers.

12. The light emitting device of claim 10, wherein the insulating layer is disposed between the second light emitting cell and the conductive support substrate, and wherein the insulating layer is not vertically overlapped with the reflective electrode of the first light emitting cell.

13. The light emitting device of claim 10, wherein the conductive support substrate is configured to be connected to an external electrode to provide an operating voltage for the first light emitting cell from the external electrode.

14. A light emitting device package comprising:
a body;
a light emitting device on the body; and
first and second lead electrodes electrically connected to the light emitting device, metal layer surrounding side surfaces of the first reflective electrode, the first metal layer directly and physically contacting a bottom surface of the first reflective electrode;
a second light emitting structure disposed on the conductive support substrate and comprising a first conductive type third semiconductor layer, a second active layer under the first conductive type third semiconductor layer, and a second conductive type fourth semiconductor layer under the second active layer;
a second reflective electrode under the second light emitting structure;
a second metal layer surrounding side surfaces of the second reflective electrode, the second metal layer directly and physically contacting a bottom surface of the second reflective electrode;
a contact part making contact with an inner portion of the first conductive type first semiconductor layer of the first light emitting structure and electrically connected to the second reflective electrode; and
an insulating layer,
wherein a top surface of the second metal layer is exposed between the first light emitting structure and the second light emitting structure,
wherein an end portion of the contact part is directly and physically connected to a bottom surface of the second metal layer,
wherein the conductive support substrate is electrically connected to a bottom surface of the second conductive type second semiconductor layer,
wherein a part of the insulating layer is disposed between the conductive support substrate and the second metal layer, and
wherein a top surface of the part of the insulating layer directly and physically contacts a bottom surface of the second metal layer.

15. The light emitting device package of claim 14, wherein the insulating layer is disposed between the contact part and the second conductive type second semiconductor layer and between the contact part and the first active layer.

16. The light emitting device package of claim 14, wherein the second metal layer serves as an etching stopper through an isolation etching process to isolate the first light emitting structure from the second light emitting structure.

* * * * *